US005788084A

United States Patent [19]
Onishi et al.

[11] Patent Number: 5,788,084
[45] Date of Patent: Aug. 4, 1998

[54] AUTOMATIC TESTING SYSTEM AND METHOD FOR SEMICONDUCTOR DEVICES

[75] Inventors: Takeshi Onishi, Gyoda; Tadashi Kainuma, Gunma; Katsumi Kojima, Hasuda; Bannai Kuniaki, Gunma; Tanaka Koichi; Yamada Naruhito, both of Gyoda, all of Japan

[73] Assignee: Advantest Corporation, Tokyo, Japan

[21] Appl. No.: 648,060

[22] PCT Filed: Sep. 4, 1995

[86] PCT No.: PCT/JP95/01751

§ 371 Date: Jul. 1, 1996

§ 102(e) Date: Jul. 1, 1996

[87] PCT Pub. No.: WO96/09556

PCT Pub. Date: Mar. 28, 1996

[30] Foreign Application Priority Data

Sep. 22, 1994 [JP] Japan ................... 6-254361
Oct. 6, 1994 [JP] Japan ................... 6-268231
Dec. 28, 1994 [JP] Japan ................... 6-338914

[51] Int. Cl.$^6$ ................................................ B07C 5/344
[52] U.S. Cl. .................................... 209/573; 324/158.1
[58] Field of Search ........................... 209/572, 573, 209/574, 571; 414/222, 225, 226; 324/158.1

[56] References Cited

U.S. PATENT DOCUMENTS 5,307,011  4/1994  Tani ......................... 209/573 X

FOREIGN PATENT DOCUMENTS 7-178877  7/1989  Japan .
3-17574   1/1991  Japan .
3-97676   10/1991  Japan .

Primary Examiner—Boris Milef
Attorney, Agent, or Firm—Staas & Halsey

[57] ABSTRACT

An automatic testing system and method for inspecting the contact characteristics of the contact pins of each of sockets of an IC tester disposed in the testing zone of an IC handler in an automatic and efficient fashion prior to testing semiconductor devices under test is provided. A test device which is identical in shape to semiconductor devices to be tested and the electric characteristics of which are known is provided and is carried on a test tray and conveyed from the loader section to the testing zone where the test device is brought into contact with a socket to measure the contact characteristics of the socket. Upon completion of the measurement, the test device is transferred from the test tray to the customer tray, and the customer tray with the test device thereon is then temporarily stored in a tray storing means in the unloader section. Thereafter, the customer tray is conveyed to the loader section where the test device is transferred from the customer tray to the test tray. Then, the test tray with the test device thereon is conveyed from the loader section back to the test section. These procedures are repeated until all of the sockets in the test section are automatically checked for their contact characteristics.

5 Claims, 17 Drawing Sheets

AUTOMATIC TESTING SYSTEM AND METHOD FOR SEMICONDUCTOR DEVICES

FIELD OF THE INVENTION

The present invention relates to a semiconductor device testing system comprising a semiconductor device testing apparatus (commonly referred to as IC tester) having incorporated therein a semiconductor transporting and handling or processing apparatus (commonly referred to as IC handler) for transporting semiconductor devices (typically ICs, i.e., semiconductor integrated circuits) for testing and sorting the tested semiconductor devices on the basis of the test results, and particularly to an automatic semiconductor device testing system and method for automatically transporting, testing and handling or processing semiconductor devices.

BACKGROUND OF THE RELATED ART

Many of semiconductor device testing apparatus (hereinafter referred to as IC tester) for determining the electrical characteristics of semiconductor devices by applying signals of a predetermined test pattern to devices to be tested, i.e., devices under test (commonly called DUT) have a semiconductor transporting and handling apparatus (hereinafter referred to as IC handler) integrally incorporated therein for transporting semiconductor devices for testing and sorting the tested semiconductor devices on the basis of the test results. The system comprising a combination of the IC tester and the IC handler of the type described above is herein termed "semiconductor device testing system".

An example of the prior art IC handler called "forced horizontal transporting system" is shown in the form of a flow chart in FIG. 1. The illustrated IC handler 10 comprises a loader section 11 where ICs 15 to be tested which a user has beforehand loaded on a customer (user) tray 13 are transferred and reloaded onto a test tray 14 capable of withstanding high/low temperatures, a constant temperature or thermostatic chamber 20 including a test section or testing zone 21 for receiving and testing the ICs from the loader section 11, and an unloader section 12 where the tested ICs 15 which have been carried on the test tray 14 out of the constant temperature chamber 20 subsequently to undergoing a test in the test section 21 are transferred from the test tray 14 to the customer tray 13 to be reloaded on the latter (generally, the tested ICs are often sorted by categories based on the data of the test results and transferred onto the corresponding customer trays.) Depending upon the type of ICs to be tested (in the case of the surface mount type ICs or the like each packaged in a dual-in-line flat package, for example), each IC may be loaded on an IC carrier, and then the IC carrier loaded with the IC may be placed on a customer tray.

The test tray 14 is moved in a circulating manner from and back to the loader section 11 sequentially through the constant temperature chamber 20 and the unloader section 12. More specifically, the test tray 14 loaded with ICs 15 to be tested is transported from the loader section 11 to a soak chamber 22 within the constant temperature chamber 20 where the ICs 15 placed on the tray 14 are heated or cooled to a predetermined constant temperature. Generally, the soak chamber 22 is adapted to store a plurality of (say, nine) test trays 14 stacked one on another such that a test tray 14 newly received from the loader section 11 is stored at the bottom of the stack while the uppermost test tray is delivered to the testing zone 21. The ICs 15 to be tested are heated or cooled to a predetermined constant temperature while the test tray 14 is moved from the bottom to the top of the stack within the soak chamber 22. The heated or cooled ICs 15 together with the test tray 14 are then transported while maintained at the constant temperature from the soak chamber 22 to the test section 21 where the ICs under test are brought into electrical contact with IC sockets (not shown) disposed in the test section 21 to be measured for their electric characteristics. Upon completion of the test, the tested ICs 15 are transported from the test section 21 to an exit chamber 23 where they are restored to the ambient temperature. Like the soak chamber 22, the exit chamber 23 is also adapted to accommodate test trays in the form of a stack. For example, the arrangement is such that the tested ICs 15 are brought back to the ambient temperature as the associated test tray is moved sequentially from the top to the bottom of the stack within the exit chamber 23. Thereafter, the tested ICs 15 as carried on the test tray 14 are passed to the unloader section 12 where the tested ICs are sorted by categories based on the data of the test results and transferred onto the corresponding customer trays 13. The test tray 14 emptied in the unloader section 12 is delivered back to the loader section 11 where it is again loaded with ICs 15 to be tested from the customer tray 13 to repeat the same steps of operation.

It is to be noted that the transfer of ICs already tested as well as ICs to be tested between the customer tray 13 and the test tray 14 is typically effected by suction transport means utilizing a vacuum pump which may pick up one to several ICs at a time for the transfer.

While the IC handler 10 illustrated in FIG. 1 is of the type which is configured to transport ICs under test as placed on the tray, IC handlers of the type adapted to transport ICs under test individually are also currently used. In the illustrated example, the test section 21 is so arranged that those in odd-numbered rows, for example, of the ICs under test carried on the test tray 14 are first tested, followed by those in even-numbered rows being tested. For this reason, two test trays 14 are shown in the test section 21. This is because the number of ICs to be tested at one time by an IC Lester is limited (say, up to thirty-two), while too many (sixty-four, for example) ICs to be tested at one time are carried on one test tray in this example. Accordingly, IC sockets are disposed in two groups in the test section 21, one of the groups consisting of thirty-two sockets arrayed in 4 lines×8 rows for ICs in odd-numbered rows to be tested and the other consisting of thirty-two sockets arrayed in 4 lines×8 rows for ICs in even-numbered rows to be tested.

It is also to be noted that there is still another type of IC handler in which ICs to be tested are transferred from the tray into a socket for the test and upon the test being completed the ICs are transferred from the socket back onto the tray, in the test section 21.

In testing the electric characteristics of ICs, after the first time regular test is completed on all of the ICs in a lot to be tested, it may be desirable to immediately retest a certain category or categories of ICs, depending on the results of the first test. In the prior art gravity-falling type IC handler (not shown), the test section is disposed at a higher elevation while the loader and unloader sections are located at a lower elevation so that ICs already tested may be caused to slide down a transport means such as a slant trough from the test section to the unloader section. Such arrangement, however, lacked the mechanism for delivering the tested ICs back to the loader section, so that there was no alternatives to manually carry the ICs to be retested to the loader section when it is desired to retest the ICs of the same lot.

While the general trend in recent years is toward the use of the IC handler of the forced horizontal transporting system as described above. ICs 15 to be tested are transported by the IC handler 10 while placed on the test tray 14 from the loader section 11 to the test section 21 whence upon completion of the test the tested ICs together with the test tray 14 are passed to the unloader section 12 where the ICs are sorted by categories based on the test results and transferred onto the corresponding customer trays for storage therein. With the forced horizontal transporting type IC handler, like the aforesaid gravity-falling type IC handler, there was again no alternatives to manually carry the ICs desired to be retested to the loader section. It is thus to be understood that when it is desired to retest the ICs of the same lot which were finished with the first time regular run of test and which were then classified by categories with respect to the characteristics on the basis of the test results and stored in a stocker or rack (hereinafter referred to as rack) together with customer trays 13 in the unloader section, it was heretofore impossible to carry out the retest automatically without relying on the transportation by hand.

Examples of the cases where the user desires to have the tested ICs retested may include (1) the case where in view of the results classified by the characteristics testing standards for the first time test, it is desired to effect the test by the further subdivided characteristics testing standard items; (2) the case where it is desired to test and sort ICs by the test standards regarding a certain set of characteristics during the first time test and then to test and sort them by the test standards regarding another set of characteristics during the second time test; and (3) the case where it is desired to retest merely because the testing and sorting were carried out on the basis of the erroneously set test standards or because there are some doubtful or unconvincing points about the test results.

As described above, the ICs which have undergone the first time test are sorted into typically two to eight categories on the basis of the test results. Generally, it is at the discretion of the operators of the various IC manufacturers to determine the number of categories depending on the purpose. When there are two categories, they are categories of "conforming article" and "non-conforming article". It is usual, however, to use the classification according to more than four categories. For, example, those of the tested ICs which exhibit the best test data on the performance specification may be classified into the category 0, those showing good results be the category 1, those reaching the lowest acceptable limit of the performance specification be the category 2, and those found defective be the category 3. Those of the categories 0 and 1 may be labeled conforming article for which a retest is not required while those of the categories 2 and 3 may be labeled non-conforming article or articles required to be retested. When the classification is made into eight categories, it takes a considerably long time to conduct the classification because the performance specification must be divided into eight grades.

It is heretofore a common practice to ship the tested ICs determined to be conforming articles as such while those labeled non-conforming article are all subjected to retest. The second test is carried out on different test items or according to different classification categories or under the same conditions of measurement as for the first time test, in order to detect final non-conforming articles. For this reason, those of the tested IC determined to be non-conforming article in the first time test are usually all in a group subjected to the second test. Taking the aforesaid four-category classification by way of example, the tested ICs classified under the categories 2 and 3 are all together retested. This means that it would be a waste of time and uselessly prolong the testing time to sort non-conforming articles by categories in the unloader section after the first test. Accordingly, there is a need for improving the efficiency of the testing apparatus which is an expensive equipment and reducing the operating cost by reducing the testing time to any extent.

In the test section 21, on the other hand, as described above, the ICs to be tested undergo a test for their electric characteristics while they are electrically connected with IC sockets (not shown) mounted on the tester head of the IC tester disposed in the test section 21. With an increase in the capacity and integration level of IC in recent years, the testing time required per an IC gets longer and longer, resulting in requiring a vast total time for testing all ICs of a lot or batch to be tested. In an attempt to reduce the total testing time it is a popular practice to use a method of testing a large number of ICs at a time. To this end, numerous sockets, say thirty-two, are mounted on the tester head of the IC tester as indicated above. In this connection, it is to be noted that the contact pins of each of the sockets on the tester head are brought into mechanical contact with the IC being tested so many times that they may possibly be deformed, and that the contact characteristics of the contact pins of the sockets are measured immediately before the test is started because any IC under test may be labeled non-conforming due to poor contact between the leads of the IC and the contact pins of the socket.

It is customary in the prior art to bring a test device which is identical in shape to ICs to be tested and the electric characteristics of which are known into contact with each of the sockets, and then to apply a predetermined pattern of electric signals to the socket to measure the electric characteristics of the test device to thereby determine the quality of the contact characteristics of the contact pins of each of the sockets based on the measured data. This method of inspection is extremely ineffective in that it requires quite a long time to inspect the contact characteristics of the contact pins of all the sockets as it is required to manually bring the test device into contact with each of the sockets successively to obtain the test data. Another problem with this method is that the operation by hand of bringing the test device into contact with each of the sockets is likely to distort the leads of the test device, resulting in incomplete contact, so that even some sockets with contact pins having actually good contact characteristics may possibly be determined to be defective.

SUMMARY OF THE INVENTION

It is an object of the present invention to provide an automatic semiconductor device testing method which is capable of meeting the user's needs for retesting and which is capable of automatically handling and retesting tested semiconductor devices.

Another object of the present invention is to provide an automated testing system and method for inspecting the contact characteristics of the contact pins of the sockets of an IC tester disposed in the test section of an IC handler in an automatic, efficient and reliable fashion prior to testing semiconductor devices.

Still another object of the present invention is to provide an automatic semiconductor device testing method in which classification by categories may be selectively conducted in the unloader section on those of the tested semiconductor devices labeled "non-conforming" based on the results of the first time test.

According to the present invention, an automatic semiconductor device testing system comprising a semiconductor device testing apparatus having incorporated therein a semiconductor transporting and handling apparatus of the forced horizontal transporting type for transporting semiconductor devices from a loader section to a test section to test them and then transporting the tested semiconductor devices from the test section to an unloader section to sort them on the basis of the test results is provided. The automatic semiconductor device testing system comprises a test device which is identical in shape to semiconductor devices to be tested and the electric characteristics of which are known; a customer tray for carrying the test device thereon; tray storing means disposed in each of the loader and unloader sections for storing customer trays; test trays for conveying semiconductor devices from the loader section to the unloader section through the test section; tray transfer means for transferring the customer tray stored in the tray storing means in the loader section onto the tray storing means in the unloader section; means for transferring the test device carried on the customer tray from the customer tray onto the test tray in the loader section; means for transferring the test device carried on the test tray from the test tray onto the customer tray in the unloader section; and means for storing the customer tray in the tray storing means in the unloader section.

With the construction according to the present invention, it is possible to automatically measure the electric characteristics of all of the sockets in the test section by repeatedly transporting the test device to the test section.

According to another aspect of the present invention, an automatic semiconductor device testing method for use in an automatic semiconductor device testing system comprising a semiconductor device testing apparatus having incorporated therein a semiconductor transporting and handling apparatus of the forced horizontal transporting type for transporting semiconductor devices from a loader section to a test section to test them and then transporting the tested semiconductor devices from the test section to an unloader section to sort them on the basis of the test results is provided. The automatic semiconductor device testing method comprises the steps of placing on a customer tray a test device which is identical in shape to semiconductor devices to be tested and the electric characteristics of which are known, and storing the customer tray with the test device thereon in a tray storing means disposed in the loader section; conveying the customer tray stored in a tray storing means in the loader section to a transfer station in the loader section; transferring the test device carried on the customer tray from the customer tray onto the test tray in the loader section; conveying the test tray to the test section to bring the test device carried thereon into electric contact with a socket in the test section for measuring the contact characteristics of the socket; upon completion of the measurement, transferring the test device from the test tray to the customer tray in the unloader section; storing the customer tray with the test device thereon in a tray storing means in the unloader section; transferring the customer tray stored in the tray storing means in the unloader section to the tray storing means in the loader section; and repeating the aforesaid steps until all of the sockets in the test section are checked for their contact characteristics.

According to still another aspect of the present invention, an automatic semiconductor device testing method for use in an automatic semiconductor device testing system comprising a semiconductor device testing apparatus having incorporated therein a semiconductor transporting and handling apparatus of the forced horizontal transporting type for transporting semiconductor devices from a loader section to a test section to test them and then transporting the tested semiconductor devices from the test section to an unloader section to sort them on the basis of the test results is provided. The automatic semiconductor device testing method comprises the steps of placing semiconductor devices to be tested on a customer tray and storing the customer tray with the devices thereon in a tray storing means disposed in the loader section; conveying the customer tray stored in the tray storing means in the loader section to a transfer station in the loader section; transferring the semiconductor devices to be tested carried on the customer tray onto a test tray; conveying the test tray to the test section to bring the semiconductor devices carried thereon into electric contact with a socket in the test section for measuring the electric characteristics of each of the devices; upon completion of the measurement, sorting the tested devices by categories on the basis of the test results, transferring the sorted devices from the test tray onto the corresponding customer trays in the unloader section, and storing the customer trays in a tray storing means in the unloader section; and transferring at least one customer tray carrying thereon the tested devices of at least one category required to be retested from the tray storing means in the unloader section to the tray storing means in the loader section; whereby the tested devices of any one or more categories may be automatically retested.

According to yet another aspect of the present invention, an automatic semiconductor device testing method for use in an automatic semiconductor device testing system comprising a semiconductor device testing apparatus having incorporated therein a semiconductor transporting and handling apparatus of the forced horizontal transporting type for transporting semiconductor devices from a loader section to a test section to test them and then transporting the tested semiconductor devices from the test section to an unloader section to sort them on the basis of the test results is provided. The automatic semiconductor device testing method comprises the steps of placing semiconductor devices to be tested on a customer tray and storing the customer tray with the devices thereon in a tray storing means disposed in the loader section; conveying the customer tray stored in the tray storing means in the loader section to a transfer station in the loader section; transferring the semiconductor devices to be tested carried on the customer tray onto a test tray; conveying the test tray to the test section to bring the semiconductor devices carried thereon into electric contact with a socket in the test section for measuring the electric characteristics of each of the devices; upon completion of the measurement, sorting the tested devices by categories on the basis of the test results wherein the tested devices coming under more than one categories requiring a retest are gathered together without being sorted by categories and transferred to a corresponding customer tray while the tested devices coming under at least one category requiring no retest are sorted by categories and transferred to at least one corresponding customer tray; and transferring the at least one customer tray carrying thereon the tested devices required to be retested from the tray storing means in the unloader section to the tray storing means in the loader section; whereby the tested devices of more than one categories found in the first test to need a retest may be automatically retested all together without being sorted.

BRIEF DESCRIPTION OF THE DRAWINGS

FIGS. 17(a) and 17(b) are illustrations illustrating how the contact characteristics are varied depending on the position of the tester head used in the third embodiment of the automatic semiconductor device testing method according to the present invention, wherein FIG. 17(a) is a plan view showing the arrangement of the sockets in the tester head section while FIG. 17(b) is a plan view showing the test tray;

FIGS. 18(a) and 18(b) are illustration illustrating the construction of a tray positioning apparatus used in the automatic semiconductor device testing method according to the present invention, wherein FIG. 18(a) is a plan view of the apparatus while FIG. 18(b) is a schematic cross-sectional view of FIG. 18(a);

FIGS. 22(a) and 22(b) illustrate one form of the customer tray wherein FIG. 22(a) is a plan view while FIG. 22(b) is a schematic cross-sectional view of FIG. 22(a).

DESCRIPTION OF THE PREFERRED EMBODIMENTS

Now, preferred embodiments of the present invention will be described in details with reference to the accompanying drawings. Like numerals indicate like elements throughout all the drawings.

Figure 1:
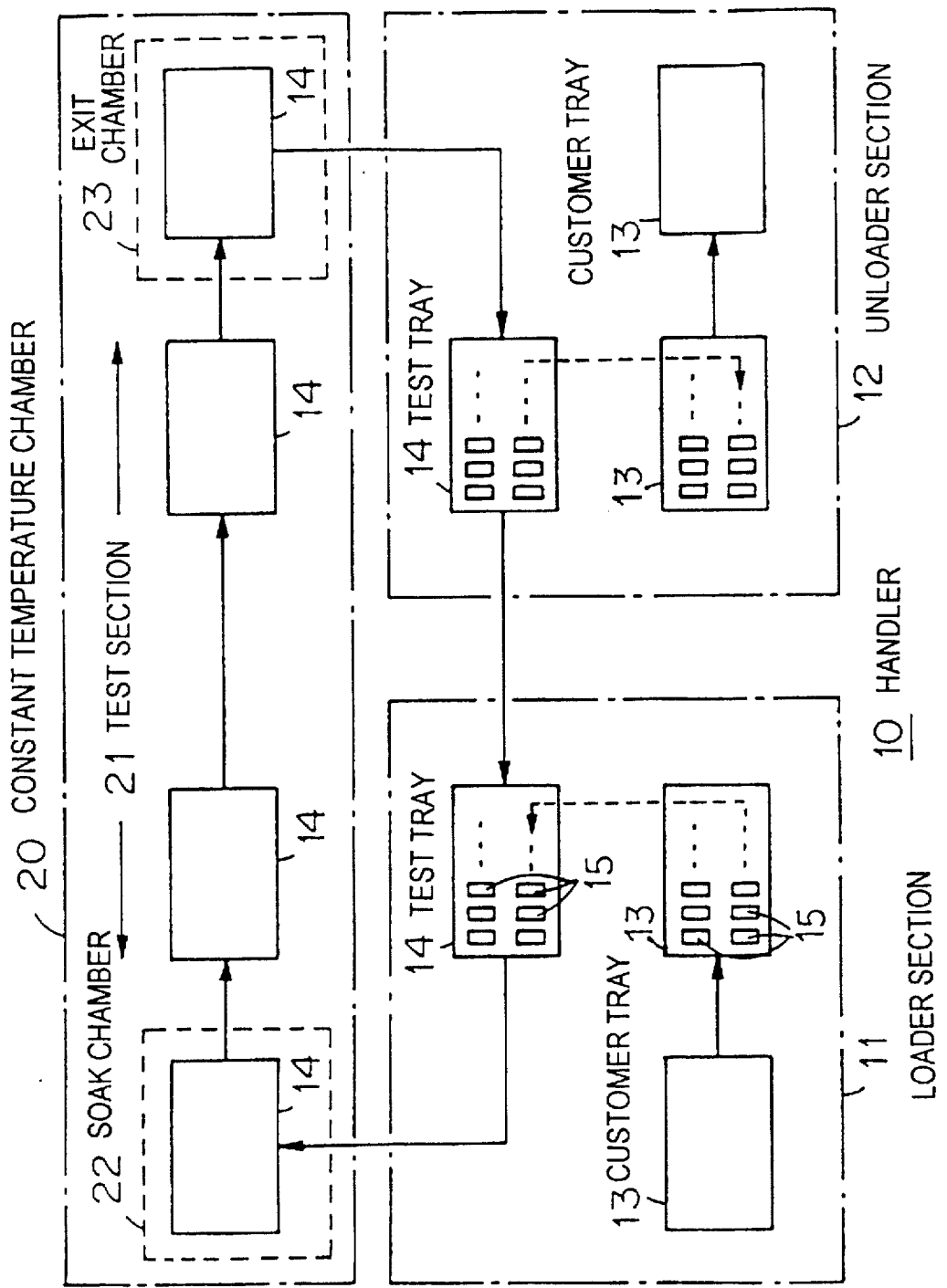
FIG. 1 is a diagrammatical illustration of the general arrangement of an example of the IC handler of the conventional forced horizontal transporting type in the form of a flow chart.
Figure 2:
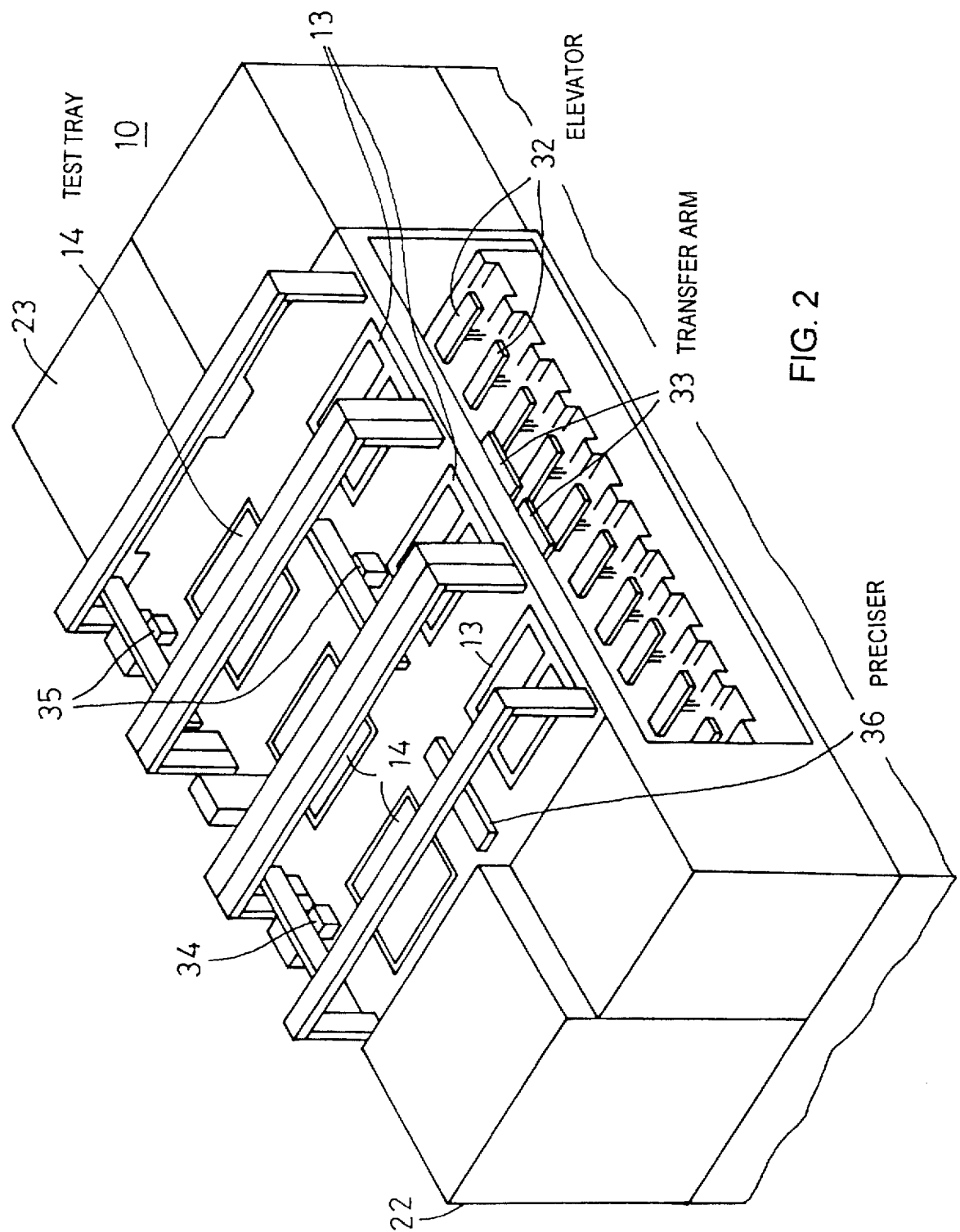
FIG. 2 is a schematic perspective view of the general construction of an example of the IC handler of the forced horizontal transporting type to which the present invention is applicable.
Figure 3:
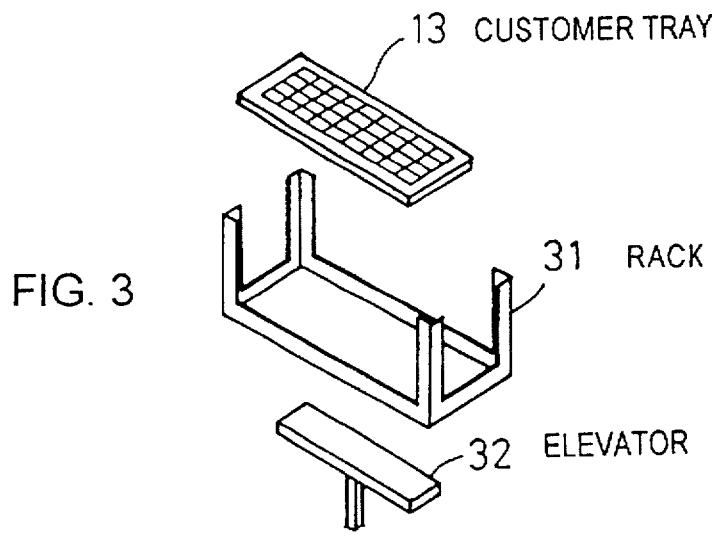
FIG. 3 is a schematic perspective view of the rack and elevator for the customer tray useful with the IC handler of FIG. 2.
Figure 4:
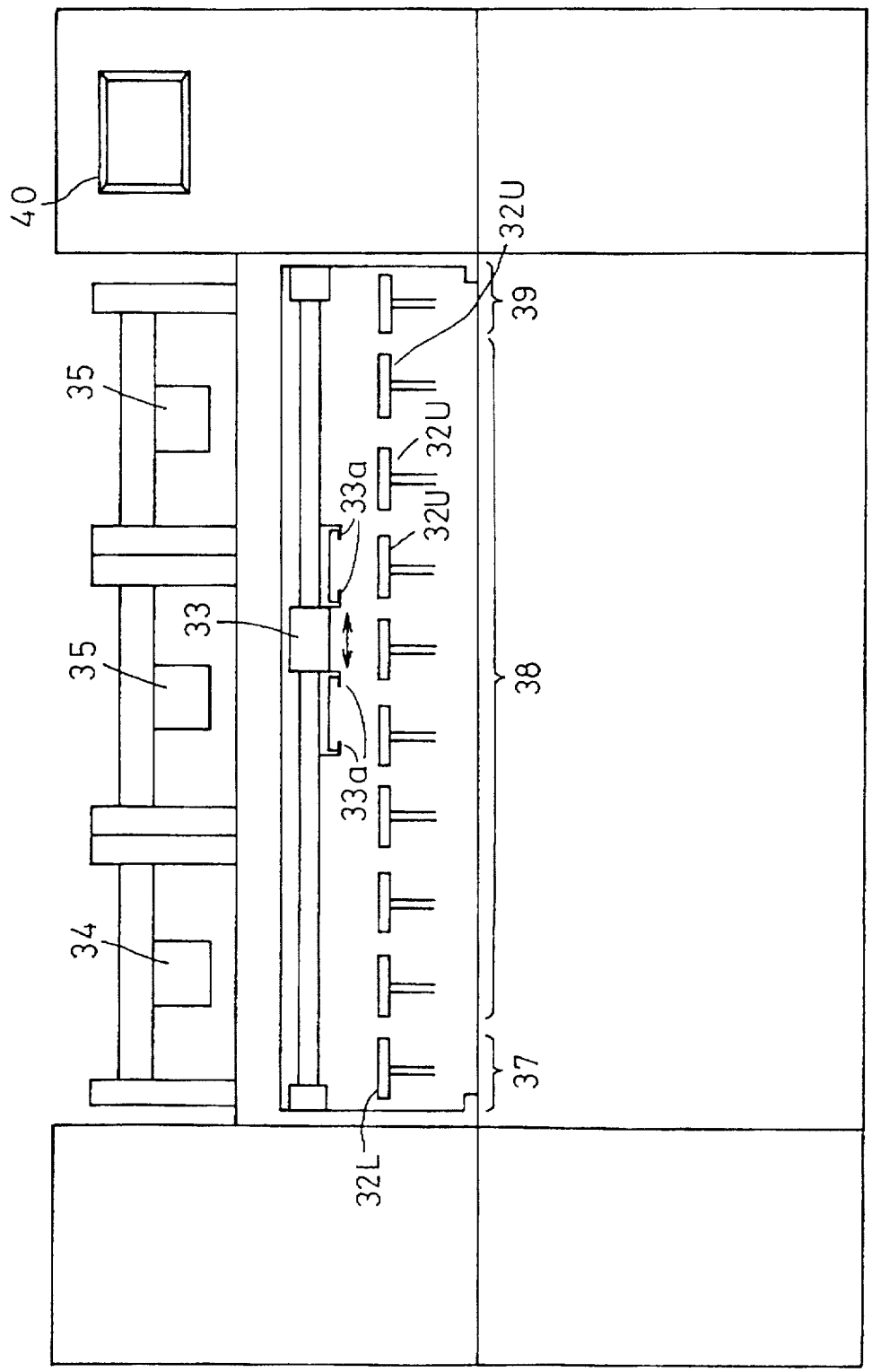
FIG. 4 is a schematic front view of the IC handler of FIG. 2.
Figure 5:
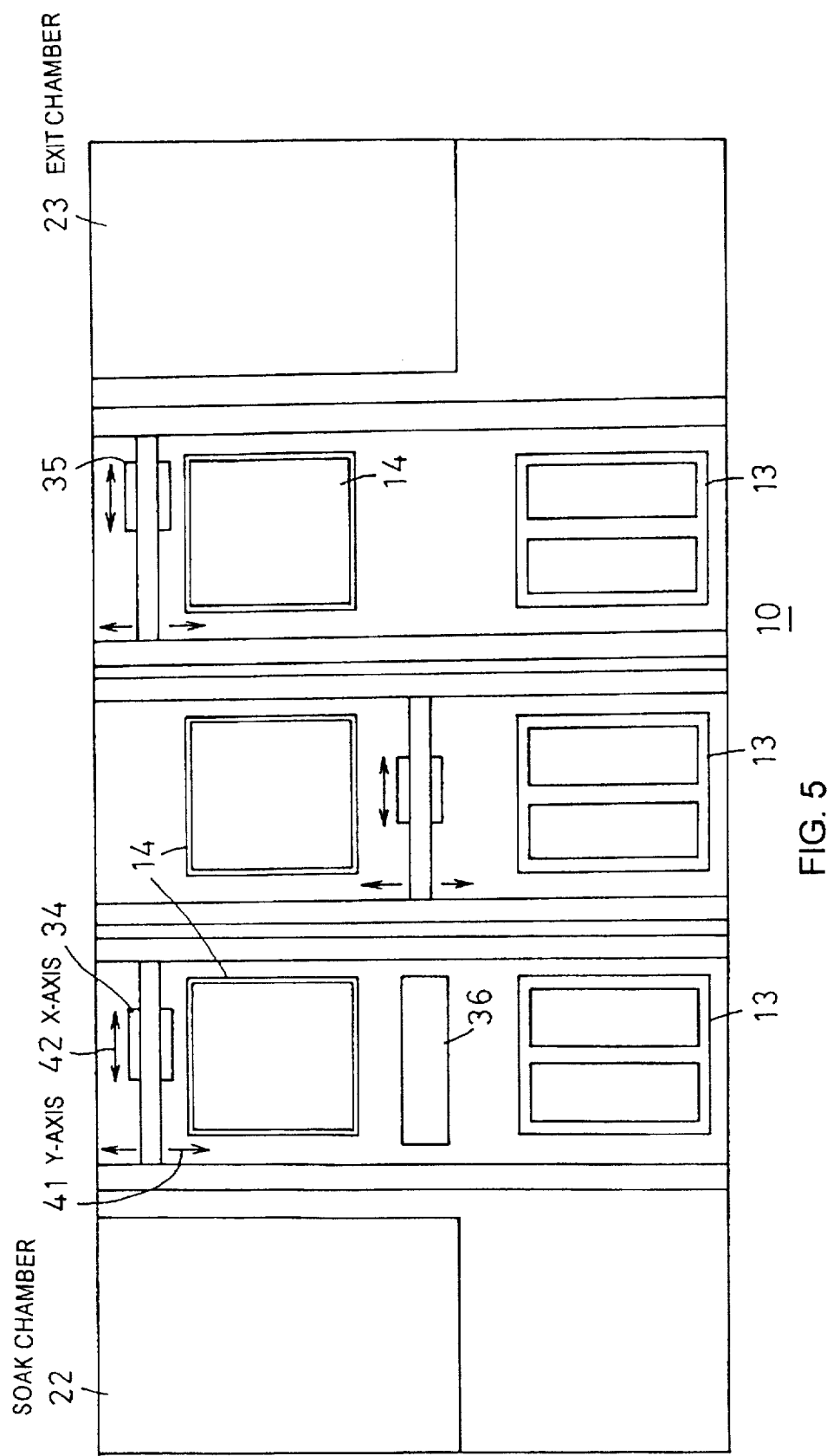
FIG. 5 is a schematic plan view of the IC handler of FIG. 2.

FIGS. 2 to 5 schematically illustrate the general construction of an IC handler of the semiconductor device testing system to which the present invention is applied. FIG. 2 is a schematic perspective view of the IC handler. FIG. 3 is a schematic perspective view of one example of the rack and elevator for the customer tray useful with the IC handler of FIG. 2, FIG. 4 is a schematic front view of the IC handler of FIG. 2, and FIG. 5 is a schematic plan view of the IC handler of FIG. 2. For the benefit of explanation, the parts corresponding to those in FIG. 1 are indicated by like reference numerals.

Briefly stated, the illustrated IC handler 10, like the previously described IC handler 10 of FIG. 1, comprises a loader section 37 where ICs to be tested which a user has beforehand placed loaded on a customer (user) tray 13 are transferred and reloaded onto a test tray 14 capable of withstanding high/low temperatures, a constant temperature or thermostatic chamber including a test section or testing zone for receiving and testing the ICs from the loader section 37, and an unloader section 38 where the tested ICs which have been carried on the test tray 14 out of the constant temperature chamber subsequently to undergoing a test in the test section are transferred from the test tray 14 to the customer tray 13 to be reloaded on the latter.

The test tray 14 is moved in a circulating manner from and back to the loader section 11 sequentially through the constant temperature chamber and the unloader section 38. More specifically, the test tray 14 loaded with ICs to be tested is conveyed from the loader section 37 to a soak chamber 22 within the constant temperature chamber where the ICs placed on the tray 14 are heated or cooled to a predetermined constant temperature. The soak chamber 22 is configured to store a plurality of (say, nine) test trays 14 stacked one on another such that a test tray 14 newly received from the loader section 37 is stored at the bottom of the stack while the uppermost test tray is delivered to the test section.

The ICs to be tested are thus heated or cooled to a predetermined constant temperature while the test tray 14 is moved from the bottom to the top of the stack within the soak chamber 22. The heated or cooled ICs together with the test tray 14 are then transported while maintained at the constant temperature from the soak chamber 22 to the test section where the ICs under test are brought into electrical contact with IC sockets (not shown) disposed in the test section to be checked for their electric characteristics.

Upon completion of the test, the tested ICs are conveyed from the test section to an exit chamber 23 where they are restored to the ambient temperature. Like the soak chamber 22, the exit chamber 23 is also adapted to accommodate test trays in the form of a stack so that the tested ICs may be brought back to the ambient temperature as the associated test tray is moved sequentially, for example, from the top to the bottom of the stack within the exit chamber 23. Thereafter, the tested ICs as carried on the test tray 14 are passed to the unloader section 38 where the tested ICs are sorted by categories based on the test results and transferred from the test tray 14 onto the corresponding customer trays 13. The test tray 14 emptied in the unloader section 38 is delivered back to the loader section 37 where ICs to be tested which have been placed on the customer tray 13 by a user are again transferred from the customer tray 13 onto the test tray 14. The same steps of operation will be thus repeated.

Although not shown in FIGS. 2 and 4, racks 31 (see FIG. 3) for accommodating customer trays 13 in the form of a stack are placed in the loader section 37 and unloader section 38 in such a manner as to be removable through the front openings of the sections. Disposed at the bottom of each of the racks 31 is an elevator (vertically movable means) 32 for lifting customer trays 13 stored in the rack 31. For this reason, the rack 31 is formed in its bottom with a generally rectangular opening through which the associated elevator 32 is free to move vertically in the rack, as shown in FIG. 3. As best seen in FIG. 4, the illustrated IC handler 10 is capable of accommodating one and eight racks 31 in the loader section 37 and unloader section 38, respectively. Disposed at the bottoms of the racks 31 in the loader and unloader sections 37 and 38 are a loader rack elevator 32L and unloader rack elevators 32U, respectively.

While in the illustrated embodiment an additional rack is stored at the right side (as viewed in FIG. 4) of the unloader section 38 with an associated elevator mounted at the bottom of the rack, the number of racks stored may be varied as desired. Further, it is to be noted that there is no definite demarcation between the loader and unloader sections 37 and 38 so that any number of racks may be distributed between the loader and unloader sections 37 and 38 as required. As the additional rack stored at the right side as viewed in FIG. 4 of the unloader section 38 is intended to be used to storing empty customer trays in the illustrated embodiment, this region is herein referred to as empty customer tray storage section 39 for the convenience of description. Of course, the rack for storing empty customer trays need not be one in number. When the number of racks used in the unloader section 38 is less than eight, the remaining rack or racks may be used as empty tray storage rack or alternatively may be housed in an other suitable location.

Mounted above the racks 31 is a tray transfer unit in the form of a transfer arm 33 for conveying customer trays 13 of a particular rack to a desired position or another rack. The transfer arm 33 comprises a body supported by and movable along an overhead guide rail transversely (right-left direction as viewed in FIG. 4) mounted, and a pair of hooks 33a extending toward from the body on the opposite ends thereof, the hooks 33a being engageable with engagement apertures formed in the customer tray 13. In the position shown in FIG. 4, the transfer arm 33 is movable transversely along the guide rail.

In addition, the guide rail is supported at its opposite ends by opposed frames for vertical (upward and downward as viewed in FIG. 4) movements, so that the transfer arm 33 may be moved vertically as well for a predetermined distance by vertical movements of the guide rail. It should be noted that in the illustrated embodiment the transfer arm 33 is permitted to be moved transversely only when it is in the position shown in FIG. 4 (position 2 in FIG. 6). The arrangement is such that the transfer arm 33 cannot be moved transversely when it is lowered from the position shown in FIG. 4 to a lower position (position 3 in FIG. 6) in which it can grip a customer tray. It is thus to be understood that the transfer arm 33 may grip the uppermost customer tray of a particular rack by engaging its hooks 33a with the engagement apertures of the tray and move the customer tray to a desired location or the location of another rack.

Mounted above the transfer arm 33 are a loader head 34 and unloader head 35 for movements in a direction of X-axis 42 (transverse) as well as in a direction of Y-axis 41 (forward-rearward) perpendicular to the X-axis. The loader head 34 is located generally above the loader section 37 and is supported by a transversely (right-left direction as viewed in FIG. 5) extending overhead guide rail for movements therealong as clearly shown in FIG. 5. This guide rail is supported at its opposite ends by a pair of opposed frames extending parallel to the direction of Y-axis 41 for movements along the frames in the direction of Y-axis. Accordingly, the loader head 34 is movable in the direction of Y-axis between the customer tray 13 and the test tray 14 both located in the loader section 37 as well as along the transverse guide rail supporting the loader head 34 in the direction of X-axis 42.

Two of the unloader heads 35 are located in juxtaposition above the loader section 37. Like the loader head 34, each of the unloader heads 35 is supported by a transversely (right-left direction as viewed in FIG. 5) extending overhead guide rail for movements therealong, and this guide rail is supported at its opposite ends by a pair of opposed frames extending parallel to the direction of Y-axis 41 for movements along the frames in the direction of Y-axis. Accordingly, each unloader head 35 is movable in the direction of Y-axis between the customer tray 13 and the test tray 14 both located in the unloader section 38 as well as along the transverse guide rail supporting the unloader head 35 in the direction of X-axis 42.

An example of the manner in which the customer tray 13 loaded with ICs to be tested is conveyed from the loader rack to the transfer position in the loader section 37 and in which the emptied customer tray 13 from which the ICs have been transferred is moved from the transfer position to a rack in the empty customer tray storage section 39 will now be described with reference to FIG. 6.

As described above, in the illustrated IC handler, one rack and an associated loader rack elevator 32L are located in the loader section 37, eight racks and associated unloader rack elevators 32U in the unloader section 38, and one rack and an associated elevator in the empty customer tray storage section 39. As illustrated in FIG. 6, the rack in the loader section 37 is referenced 31L, and the set of the rack 31L and the loader rack elevator 32L is referred to as lane 1. The racks in the unloader section 38 are referenced 31U1, 31U2, 31U3, 31U4, 31U5, . . . , 31U8 successively from the loader section 37 side, and likewise the unloader rack elevators are referenced 32U1, 32U2, 32U3, 32U4, 32U5, . . . , 32U8 successively from the loader section 37 side. The sets of rack 31U1 and unloader rack elevator 32U1, rack 31U2 and unloader rack elevator 32U2, . . . , rack 31U8 and unloader rack elevator 32U8 are referred to as lane 2, 3, . . . , 9, respectively. The rack and elevator in the empty tray storage section 39 are referenced 31E and 32E, respectively, and the set of the rack 31E and the elevator 32E is referred to as lane 10.

Figure 6:
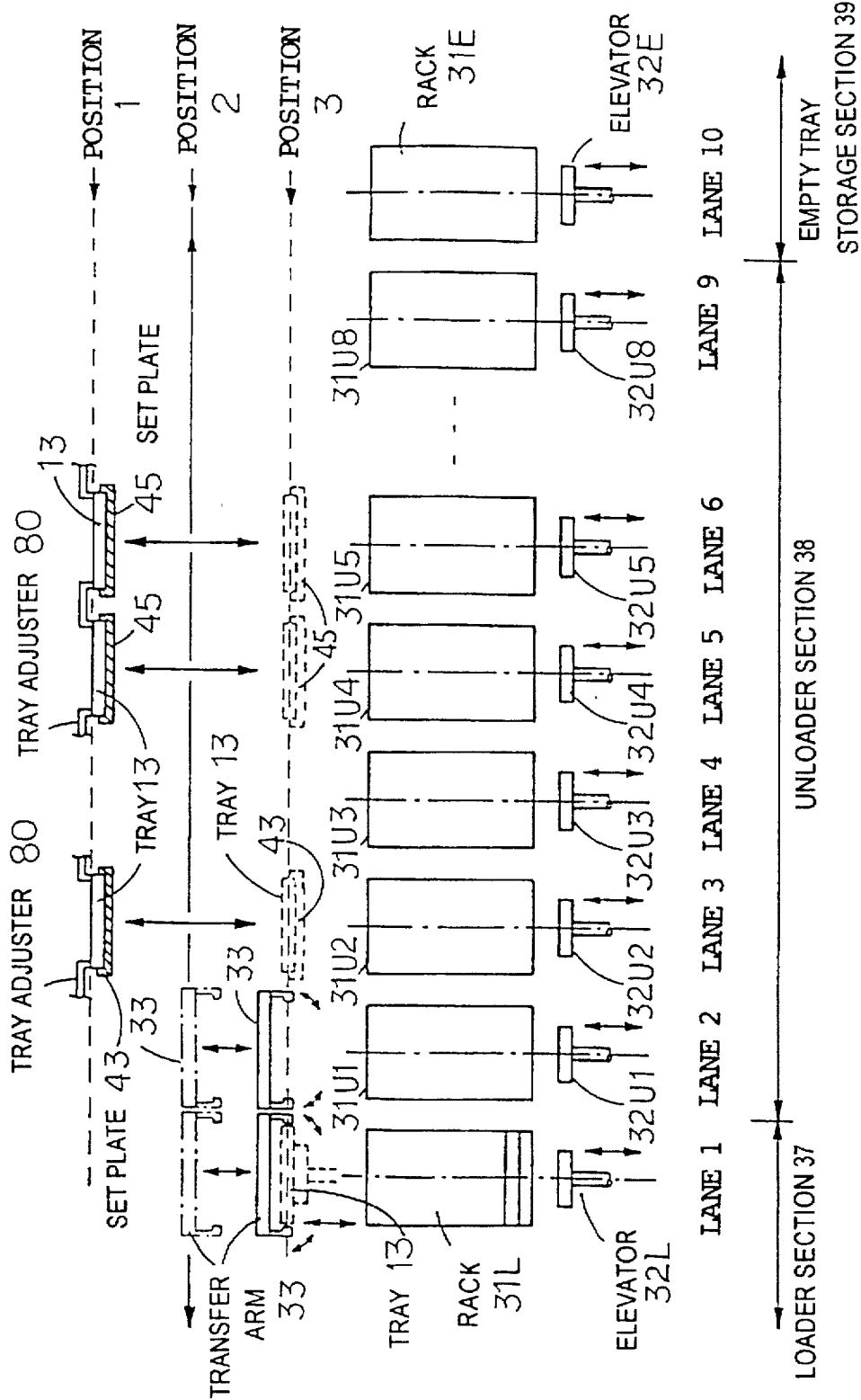
FIG. 6 is a schematic elevation view of the IC handler of FIG. 2 invention illustrating how the handler operates to transfer and convey the tray.

It should here be pointed out that the elevators 32L, 32U1-32U8, and 32E are able to lift the customer trays 13 in the associated racks to the height of the position 3 shown in FIG. 6. The transfer arm 33 may be moved vertically by drive means (not shown) between the position 3 and the next higher position 2, and in the position 2 (corresponding to the position shown in FIG. 4), it is also movable horizontally between lane 1 and lane 10. In addition, set plates 43 and 45 for temporarily carrying ICs under test in transit and transferring them from a customer tray to a test tray are mounted so as to be vertically movable between the lowest position 3 and the highest position 1 by drive means (not shown).

With the construction described above, the customer tray 13 loaded with ICs under test is delivered out of a loader rack to the transfer position in the loader section 37 in the following manner:

(1) The customer trays 13 stored in the rack 31L in lane 1 are lifted up by the elevator 32L to raise the uppermost tray to the height of the position 3 as shown in broken lines in FIG. 6.

(2) The transfer arm 33 in the position 2 is moved horizontally to the right to a position directly above the lane 1.

(3) The transfer arm 33 is lowered to the height of the position 3.

(4) The hooks 33a of the transfer arm 33 are brought into engagement with the engagement apertures of the uppermost customer tray 13 in lane 1 to have the tray gripped by the transfer arm.

(5) The transfer arm 33 together with the tray 13 gripped thereby is raised from the position 3 to the height of the position 2.

(6) In the position 2 the transfer arm 33 with the tray 13 gripped thereby is moved horizontally to the left and stopped at a position directly above the lane 3. Prior to the movement of the transfer arm 33, the loader set plate 43 is lowered from the position 1 to the position 3.

(7) The transfer arm 33 standing still in the position 2 in lane 3 is lowered to the position 3 where the hooks 33a of the transfer arm 33 are released from gripping engagement with the tray 13 and the tray 13 is deposited on the loader set plate 43.

(8) The transfer arm 33 is raised from the position 3 to the position 2, and then moved horizontally to a position directly above the lane 1.

(9) The set plate 43 having the tray 13 deposited thereon is raised from the position 3 to the position 1, waiting for the ICs 15 placed on the tray 13 to be transferred onto a test tray 14.

The manner in which the empty customer tray 13 on the loader set plate 43 is stored into the rack 31E in the empty tray storage section 39 is as follows:

(1) The loader set plate 43 is lowered from the position 1 to the position 3 to move the empty customer tray 13 down to the position 3.

(2) The transfer arm 33 is moved horizontally from the position 2 in lane 1 to the right and stopped at a position directly above the lane 3 in the unloader section 38.

(3) The transfer arm 33 is lowered from the position 2 to the position 3 where the hooks 33a of the transfer arm 33 are engaged with the engagement apertures of the empty customer tray 13 to have the tray gripped by the transfer arm.

(4) The transfer arm 33 with the empty tray 13 gripped thereby is raised from the position 3 to the position 2 to hold the empty tray 13 at rest.

(5) In the position 2 the transfer arm 33 with the empty tray 13 gripped thereby is moved horizontally to the right and stopped at a position directly above the lane 10 in the empty tray storage section 39.

(6) The transfer arm 33 is lowered from the position 2 to the position 3 in which the empty tray 13 is maintained.

(7) The elevator 32E is driven until the uppermost tray of a stack of empty trays stored in the rack 31E in the empty tray storage section 39 is lowered by one thickness of tray from the position 3.

(8) The hooks 33a of the transfer arm 33 are released from gripping engagement with the tray and the empty tray is deposited from the transfer arm onto the top of the stack of empty trays.

(9) The transfer arm 33 is raised from the position 3 to the position 2, and then moved horizontally and stopped at a position directly above the lane 1.

(10) The elevator 32E in the empty tray storage section 39 is moved down to store the empty tray into the rack 31E.

On the other hand, when tested ICs are to be transferred from a test tray 14 back to a customer tray 13 in the unloader section 38, the uppermost empty customer tray 13 in the rack 31E in the empty tray storage section 39 is deposited on the unloader set plate 45 standing still in the position 3 by the reverse operation of the transfer arm 33 to that described above, and then the unloader set plate 45 is raised from the position 3 to the position 1 where the set plate 45 is stopped with the empty customer tray 13 waiting in the transfer position in the unloader section 38. It can readily be understood that after receiving tested ICs from the test tray 14 in this transfer position, the customer tray 13 loaded with the tested ICs will be stored in a rack in a designated lane (any one of the lanes 2 to 9) in the unloader section 38 by the reverse operation to that in the loader section 37 described above. Accordingly, the further description is omitted.

It is noted that the illustrated IC handler is equipped with two unloader set plates 45 in the unloader section 38 so that as is clearly seen from FIGS. 2 and 4, tested ICs may be transferred concurrently from two test trays back to corresponding two customer trays. Specifically, the tested ICs are picked up and carried by unloader heads 35 from the test trays to the customer trays for transfer.

Figure 7:
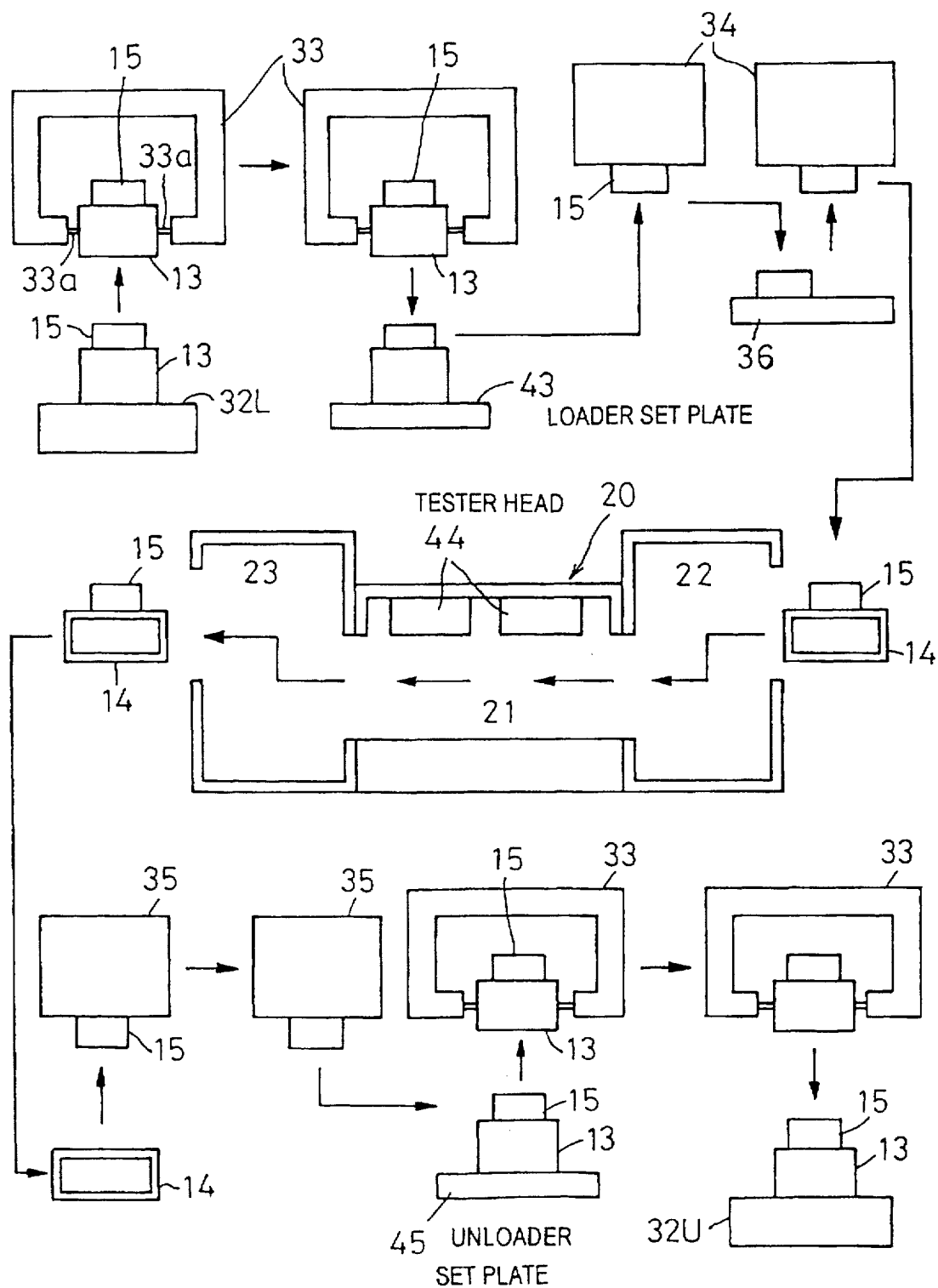
FIG. 7 is a schematic illustration illustrating the transferring and conveying operation of the IC handler of FIG. 2 in the form of a flow chart.

In the loader section 37, ICs to be tested are first deposited from a customer tray 13 placed on a loader set plate 43 onto a "preciser" 36 (see FIG. 4) on which the ICs to be tested are precisely positioned prior to be transferred to the test tray 14. For this transfer from the preciser 36 to the test tray 14, the tested ICs are again picked up and carried by a loader head 34. Subsequently, as described previously, the ICs 15 under test placed on the test tray 14 are transported to the constant temperature chamber 20 where they are passed through the soak chamber 22 prior to being conveyed to the testing zone 21. In the test section the ICs are brought into electrical contact with IC sockets of tester heads 44 (see FIG. 7) to undergo a test. Upon completion of the test, the tested ICs are delivered through the exit chamber 23 to the unloader section 38. Shown in the form of a flow chart in FIG. 7 are these sequential operations of the IC handler.

Figure 22A:
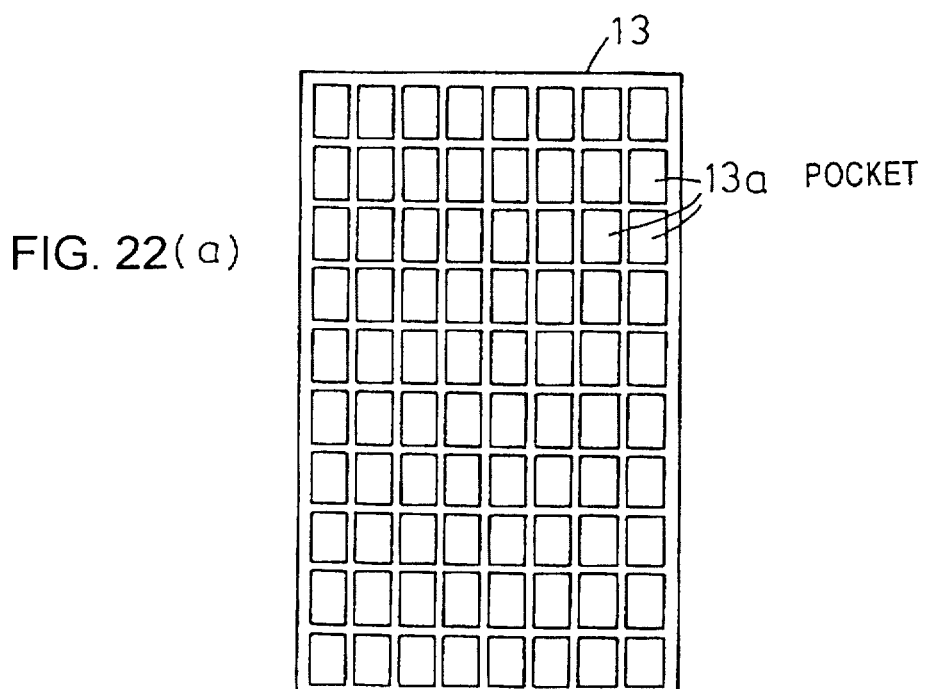
Figure 22B:
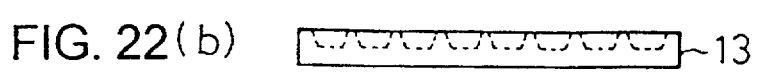

The set plate 43 will be described below in more details. (The description of the loader set plate 43 will be representative of that of the unloader set plate 45 as they are identical in construction.) The set plate 43 comprises a planar platform and may be vertically moved and stopped at any desired position by vertically driving means as in the form of a pulse motor 82, as illustrated in FIGS. 18 and 19. On the other hand, the customer tray 13 is provided with a multiplicity of recessed pockets 13a for housing the ICs to be tested, as shown in FIG. 22. The customer tray 13 with the ICs to be tested housed in its pockets 13a is conveyed onto the set plate 43 and placed thereon in position in the manner previously stated.

Figure 20:
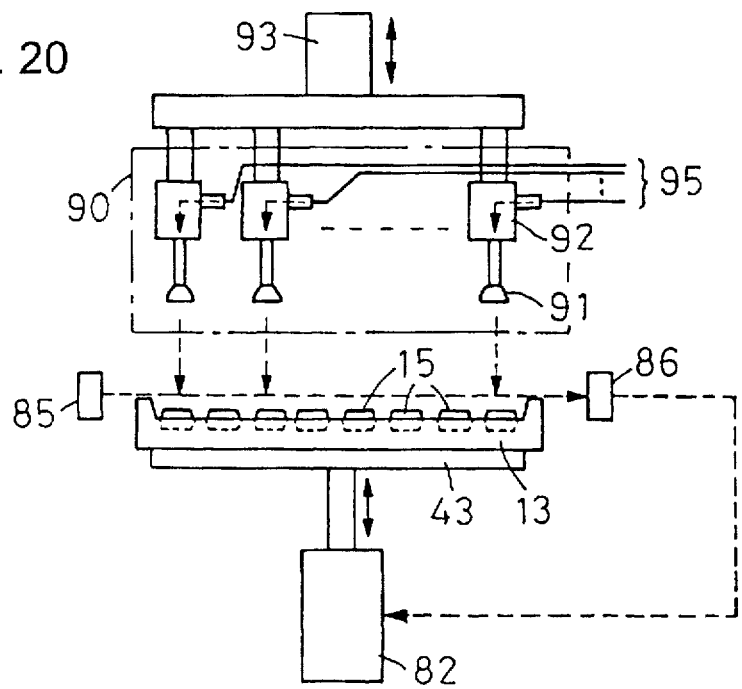
FIG. 20 is a schematic side view illustrating the construction of a device suction-attracting apparatus used in the automatic semiconductor device testing method according to the present invention.
Figure 21:
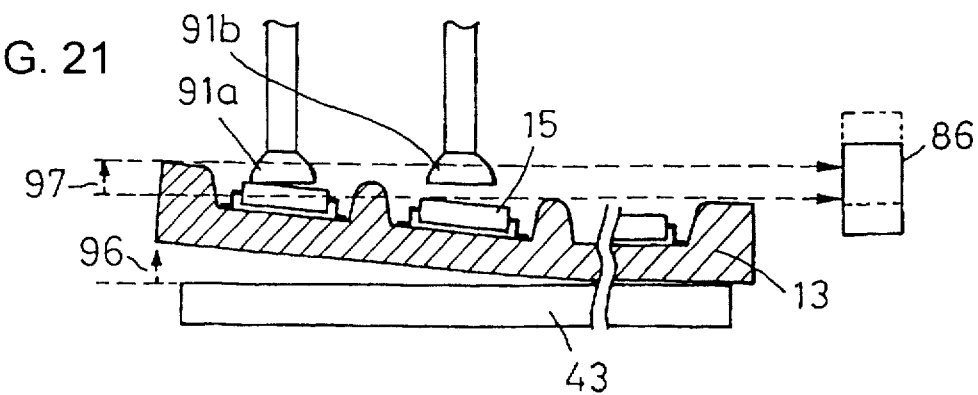
FIG. 21 is a schematic cross-sectional view illustrating how the suction-attracting apparatus would fail to pick up the devices should the customer tray be distorted.

The customer tray 13 is typically made of plastic molding, so that it may be subject to deformation such as warping and bending due to variability with time, temperature changes and the like. In view of this, an optical sensor means for detecting the top edge of the customer tray 13 is provided. As shown in FIG. 20, the sensor means comprises a light emitting diode 85 and a photodetector 86 in horizontally opposing relation with each other at the opposite sides of the set plate 43 thereabove such that the top edge of the customer tray 13 is detected by intercepting the light emitted from the LED 85 as the customer tray 13 carried on the set plate 43 is moved upward by the driving means 82. The driving means 82 is responsive to the detected signal to be deactivated to thereby stop the set plate 43. If the tray 13 is distorted as shown in FIG. 21 such that the top edge of the tray on one side is higher than it were normally, the sensor would detect the top edge of the tray 13 earlier than normally, so that the set plate 43 would be stopped below a predetermined level. As a result, when suction pick-up unit 90 is lowered by an associated vertically moving unit 93, some (indicated at 91a, for instance) of the suction rubber pads 91 of the pick-up unit 90 may almost normally pick up the devices from the tray 13 whereas some (indicated at 91b, for instance) of the rubber pads may undesirably fail to pick up the devices 15 from the tray 13.

Further referring to FIG. 20, a suction head 92 is connected with a source of vacuum 95, the arrangement being such that when it is desired to attract the device 15, the suction head 92 is activated to maintain vacuum to attract and hold the device against the rubber pad 91. In order to release the device 15 the suction head is deactivated to break the vacuum. The vertically moving unit 93 acts to lower the suction pick-up unit 90 to such position as to contact the rubber pad with the device 15. The distance of this downward travel is fixed. It is thus to be understood that should the set plate 43 be stopped below the predetermined level due to the tray 13 being distorted, some of the suction rubber pads 91 would fail to touch the devices as stated above because of the fixed travel of downward movement of the rubber pads. Schematically shown at 94 is X-axis and Y-axis moving unit for moving the pick-up unit 90 in the directions of X- and Y-axes as required.

There are rare cases where even a non-warped normal tray may be lifted up as such. That is, when such tray 13 empty of devices is being picked up, the entire tray may be lifted up by the combined attracting force of a plurality of suction rubber pads 91. As a consequence, the tray 13 may be shifted in position and/or devices placed on an other tray may jump out of the tray due to vibrations, resulting in failure to pick up devices.

In the unloader section 38, devices 15 picked up and carried by rubber pads 91 of the suction pick-up unit 90 of construction identical to that shown in FIG. 20 are dropped by gravity into pockets of an empty customer tray 13. In this case as well, should the tray 13 be deformed, the position at which the unloader set plate 45 is stopped would be lower than normal, resulting in a longer distance that some of the devices would drop by gravity. Consequently, some of the devices would not possibly be received in the pockets in a stable manner. That is, such devices may undesirably tilt or be dislocated out of the pockets.

Figure 18A:
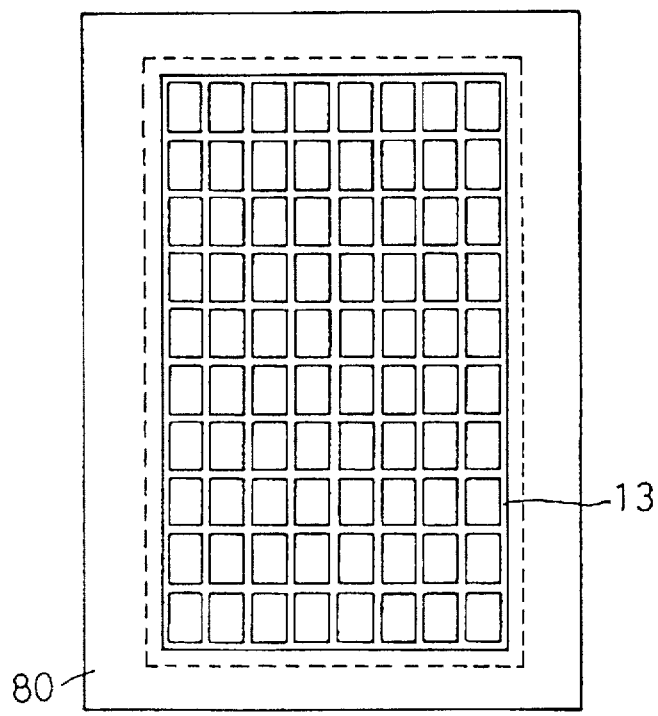
Figure 18B:
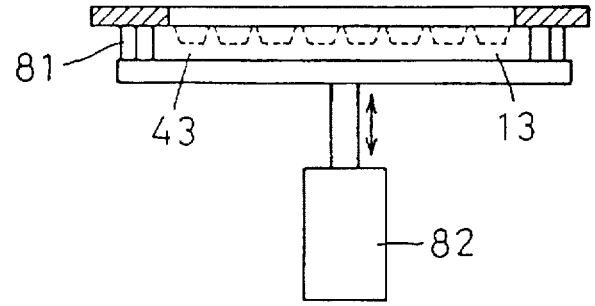
Figure 19:
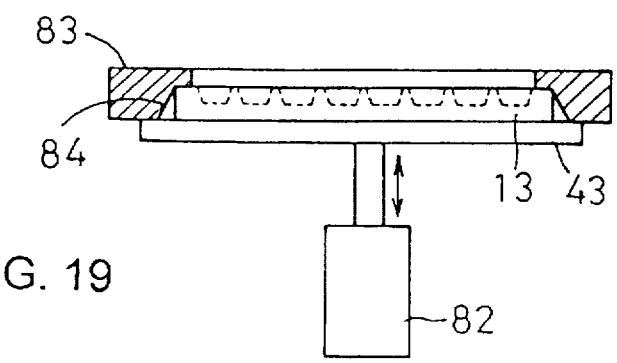
FIG. 19 is a schematic cross-sectional view illustrating the construction of another form of the tray positioning apparatus used in the automatic semiconductor device testing method according to the present invention.

In order to avoid such situation, the IC handler embodying the present invention may employ a tray adjuster 80 in the form of a frame for retaining the whole peripheral surface of a tray 13 as shown in FIGS. 18(a) 18(b), in place of the optical sensor. The tray adjuster 80 is located and fixed in position by one thickness of tray above the normal stop position which the set plate 43 assumes as it is raised. It is thus to be appreciated that when the set plate 43 with the tray 13 placed thereon is moved up to a predetermined upper position by the vertically driving means 82, the tray 13 is retained on its entire peripheral surface by the tray adjuster 80, whereby the tray 13 is corrected for any deformation as seen in FIG. 18(b). The tray 13 is thus always held at a constant level, so that there is no likelihood that any trouble such as failure of the rubber pads 91 of the suction pick-up unit 90 to pick up devices may occur. Nor the problem of "lift-up" of the tray 13 may occur. In the embodiment illustrated in FIGS. 18(a) 18(b), the set plate 43 has stops 81 upstanding therefrom at its opposite sides. The stops 81 are intended to prevent the upward overshooting of the set plate 43, and also act as a protector to prevent excessive pressure from being exerted on the tray 13, but need not necessarily be provided.

FIG. 19 shows an alternate form of the tray adjuster eliminating the stops. This tray adjuster 83 has a thickness greater by approximately one thickness of the customer tray than the tray adjuster 80 of FIGS. 18(a) 18(b), and the inner wall of the additional thickened portion defining the opening is downwardly outwardly tapered at 84. In other words, the tray adjuster 83 has a stepped opening means defined by an opening identical to the opening of the tray adjuster 80 of FIGS. 18(a) and 18(b) and an enlarged, downwardly outwardly flared extension opening formed through the additional thickened portion. In addition, the longitudinal and transverse dimensions of the flared extension opening are less than the corresponding dimensions of the set plate 43 so that as the latter is moved upward, it comes into abutment against the undersurface of the tray adjuster 83.

With the construction just described above, as the set plate 43 with the tray 13 placed thereon is moved upward by the vertically driving means 82, the tray 13 is raised while retained or guided on its entire peripheral surface by the tapered wall 84 of the tray adjuster 83. When the set plate 43 arrives at a predetermined upper position, the tray 13 is completely retained on its entire peripheral surface by the tray adjuster 83 as shown in FIG. 19, whereby the tray 13 is corrected for any deformation and positioned in alignment. The tray 13 is thus always held at a constant level and maintained in alignment, so that there is no likelihood that any trouble such as failure of the rubber pads 91 of the suction pick-up unit 90 to pick up devices may occur. Nor the problem of "lift-up" of the tray 13 may occur. Further, in this embodiment since the tray adjuster 83 has the function as a stop means, there is no need to provide any stop means such as stops 81 on the set plate 43 at its opposite sides.

The automatic device testing method according to the present invention will be described with reference to FIGS. 8–10.

Figure 8:
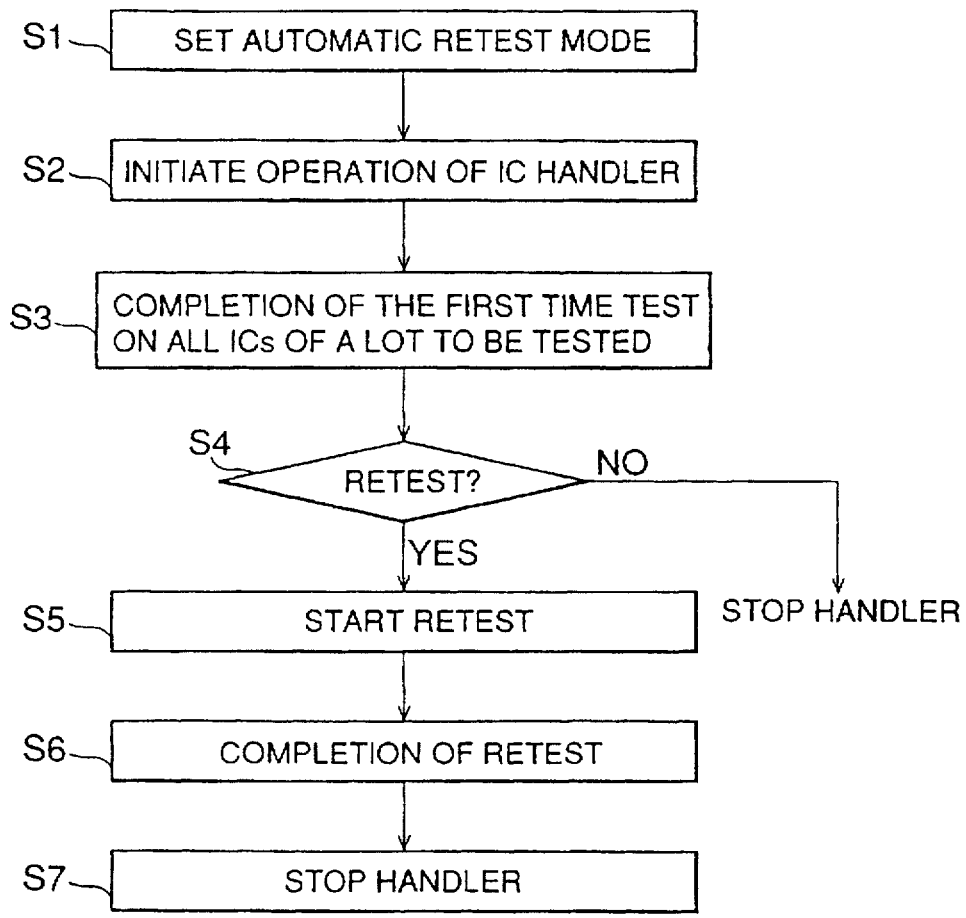
FIG. 8 is a flow chart illustrating the operational sequence of a first embodiment of the automatic semiconductor device testing method according to the present invention.
Figure 9:
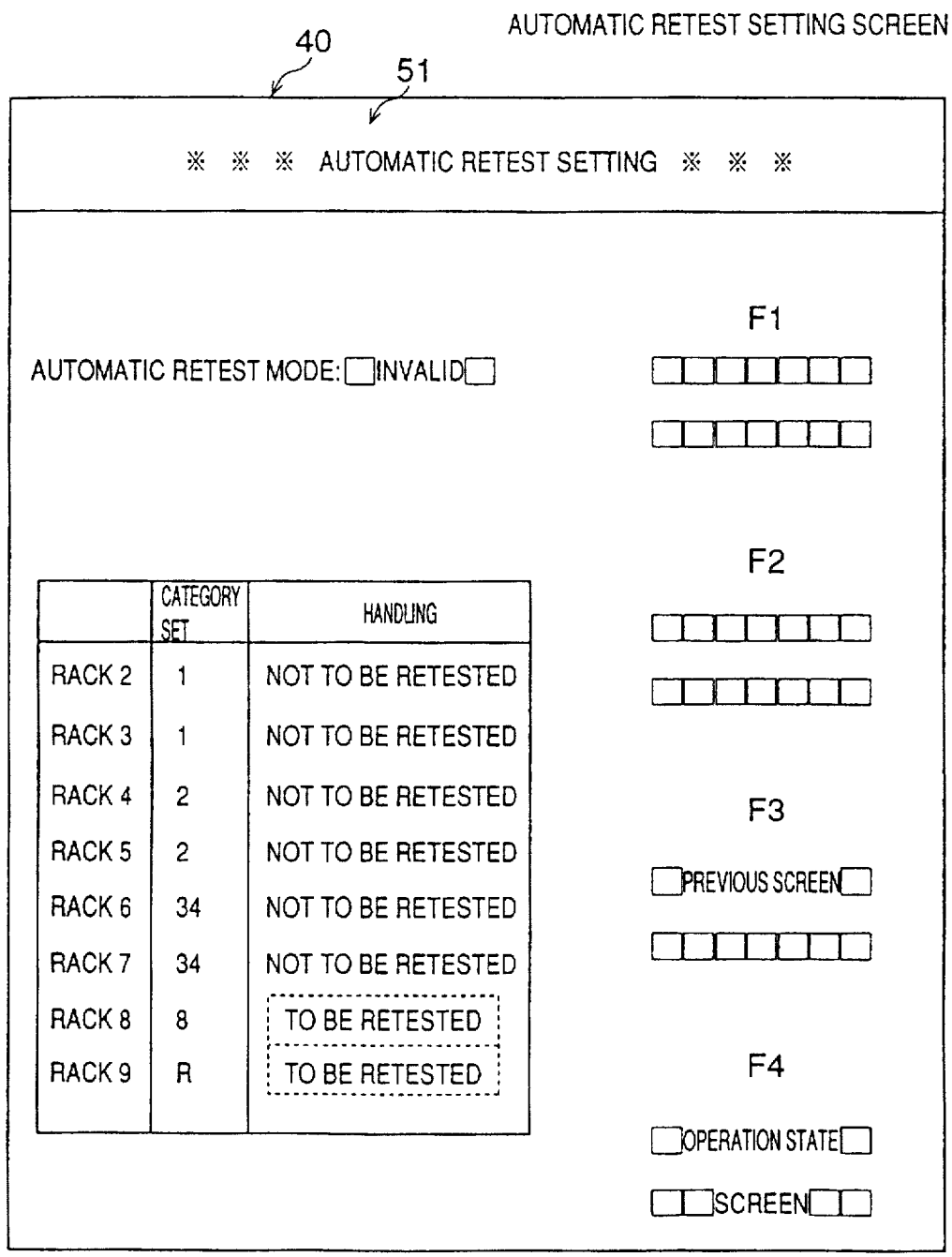
FIG. 9 illustrates an example of the screen image on the display used in the first embodiment of the automatic semiconductor device testing method according to the present invention.
Figure 10:
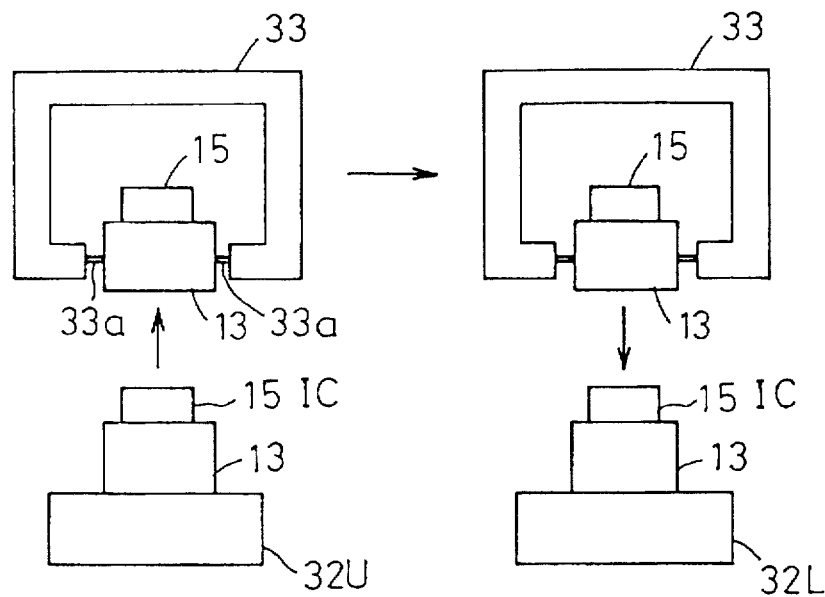
FIG. 10 is a schematic illustration illustrating the transferring operation of the first embodiment of the automatic semiconductor device testing system according to the present invention.

FIG. 8 is a flow chart illustrating the operation of the first embodiment of the automatic testing method according to the present invention, FIG. 9 illustrates the screen image on the display unit of the IC handler to which the present invention is applied, and FIG. 10 is an illustration illustrating how the customer tray in the unloader rack is carried to loader rack.

Referring to FIG. 9, the display screen 40 of the controller for setting the control sequence of the IC handler is first operated to generate an automatic retest setting screen 51 on which when the automatic retest mode is not to be executed, the message "INVALID" is maintained unchanged as illustrated whereas "INVALID" is changed to "VALID" when the automatic retest mode is to be executed.

When the retest mode is switched to "VALID," retesting on the racks 8 and 9 (corresponding to the racks 31U7 and 31U8 in lanes 8 and 9, respectively) designated "TO BE RETESTED" will be automatically effected. No retesting will be carried out on the racks 2–7 (corresponding to the racks 31U1–31U6 in lanes 2–7, respectively) designated "NOT TO BE RETESTED," whether the mode is made "VALID" or "INVALID."

When the automatic retest mode is switched to "VALID", and the program for executing automatic retesting is set, the operation will take place as follows:

As shown in FIG. 8, the automatic retest mode is set in step S1, followed by the operation of the IC handler being initiated in step S2. The first time test is thereby conducted on all of the ICs 15 of one lot to be tested (step S3). Upon completion of the first time test, the handler first gives the stop alarm to check in step S4 whether or not the automatic retest should be carried out in accordance with the automatic retest setting preliminarily made. In this example, since the setting is made to conduct the automatic retest with no subsequent change made to the setting, the operation proceeds to step S5 in which the retest is started. On the contrary, if the automatic retest setting is not made preliminarily, or if the automatic retest mode is changed to "INVALID" during the first time test, the operation of the handler is terminated in step S4 in which "NO" meaning not to effect retesting is ascertained.

At the point of time when the first time test has been completed in step S3, the customer trays loaded with the ICs tested and sorted by categories on the basis of the results of the first time test are stored into corresponding ones of the eight racks 2 to 9 in the unloader section 38.

Upon the retest being initiated in step S5, the customer trays stored in the racks 8 and 9 designated "TO BE RETESTED" in the unloader section 38 are carried into the rack 31L in the loader section 37 by the transfer arm 33.

This operation of transportation is shown in the form of a flow chart in FIG. 10. As the manner in which the transfer arm 33 transports the customer tray is identical with respect to any customer tray, the transporting operation will be described below with the understanding that the elevator referenced 32U in FIG. 10 represents the elevators 32U8 and 32U9 disposed at the bottoms of the racks 8 and 9 in the unloader section 38.

When the uppermost customer tray 13 stored in the rack is lifted up to the position 3 by the upward motion of the elevator 32U, the transfer arm 33 is lowered from the position 2 to the position 3 where the hooks 33a of the transfer arm 33 are brought into engagement with the engagement apertures of the customer tray 13 to grip the tray. Next, the transfer arm 33 having the tray gripped thereby is raised from the position 3 to the position 2, and then moved to the right as viewed in FIG. 10 and stopped at a position directly above the rack 31L in the loader section 37. Thereafter, the loader rack elevator 32L is moved upward to and stopped at a position by one thickness of the tray below the position 3, whereupon the transfer arm 33 is lowered to the position 3 in which the hooks 33a are opened to release the tray. In doing this, if one or more other customer trays have already been stored in the rack 31L, the upward movement of the elevator 32L is so controlled that the uppermost customer tray is moved up and stopped at a position by one thickness of the tray below the position 3, whereby the newly transferred customer tray 13 is placed on the loader rack elevator 32L. It is thus to be appreciated that the customer tray 13 loaded with the ICs 15 finished with the test and sorted by categories may be transferred from a particular rack in the unloader section 38 to the rack 31L in the loader section 37 by means of the transfer arm 33. It will also be readily understood that the customer tray 13 may be transferred from any other rack in the unloader section 38 to the rack 31L in the loader section 37 in a like manner by means of the transfer arm 33. It is also possible to transfer from the rack 31L in the loader section 37 to a particular rack in the unloader section 38 or between the racks in the unloader section 38, as required. Further, it is needless to say that the present invention is also applicable to the IC handler utilizing magazines instead of trays.

The retest of the step S5 illustrated in FIG. 8 is conducted in an operational sequence similar to that of the first time test, and upon completion of the retest (step S6), the handler is stopped (step S7).

In this manner, according to the first embodiment of the present invention, after the first time regular test is completed on all of the ICs of one lot to be tested, it is possible to immediately conduct an automatic retest on one or more desired categories of the ICs classified by categories, whereby it is made possible to automate and save labor required for the retesting process, leading to an improvement on the productivity. In addition, information helpful to the improvement of quality may be obtained since ICs may be subjected to closer examination and sorted by categories. Moreover, the present invention provides the advantage of complying with the various needs of the users.

The second embodiment of the automatic testing method according to the present invention will next be described with reference to FIGS. 11 and 12. In the first embodiment described above, the ICs subjected to the first time test are sorted by categories, and deposited on the corresponding customer tray for each category which is stored in the corresponding rack in the unloader section 38, whether or not the retest may be carried out. However, when there are more than four categories into which tested ICs are to be classified, it takes a considerably long time to effect the sorting. In view of this, the second embodiment of the present invention contemplates to provide means for subjecting the tested devices of more than one categories all together to a retest without sorting them by categories in the unloader section 38 at the discretion of the operator, if those of the tested devices which have been found to need a retest come under more than one categories.

Figure 11:
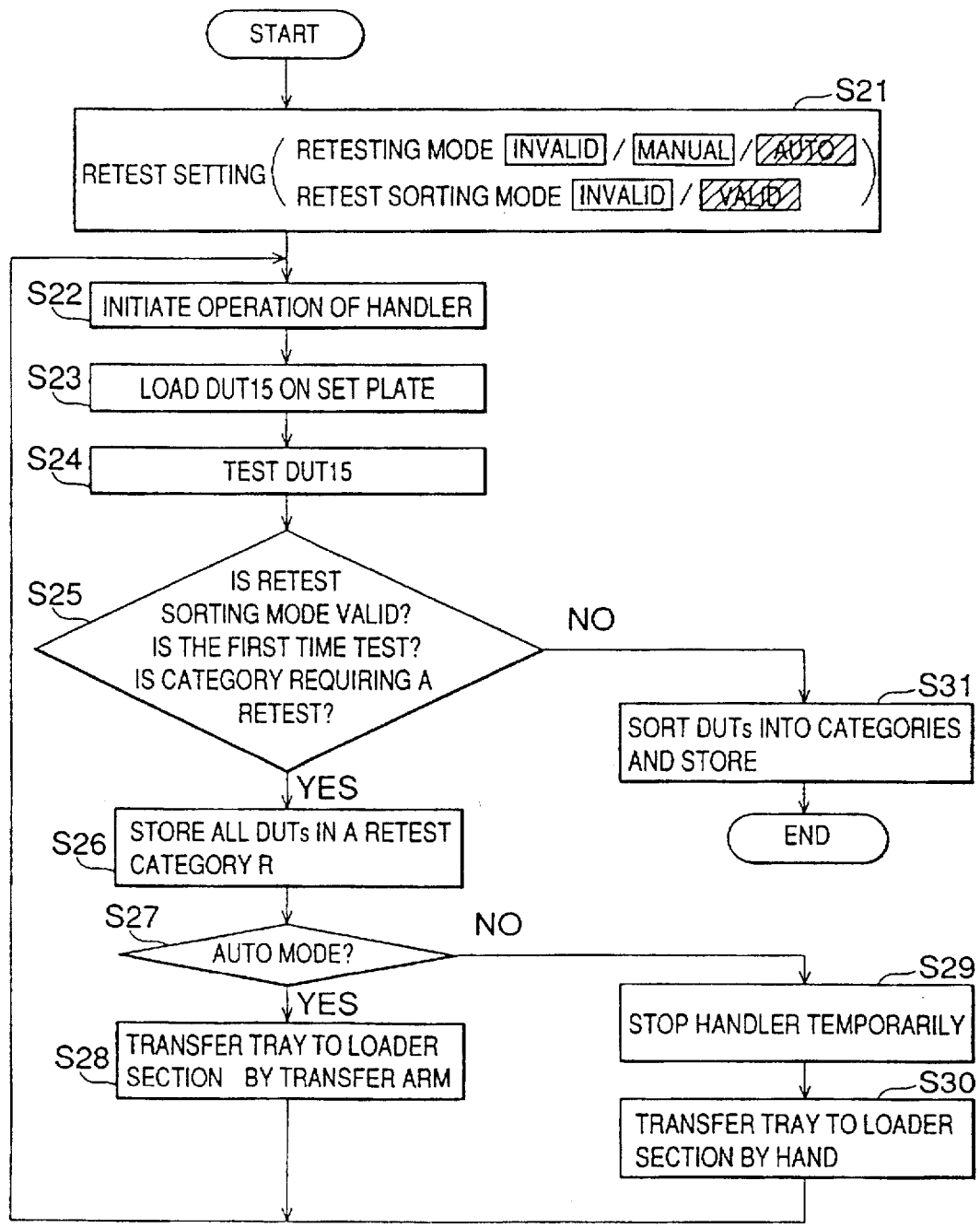
FIG. 11 is a flow chart illustrating the operational sequence of a second embodiment of the automatic semiconductor device testing method according to the present invention.
Figure 12:
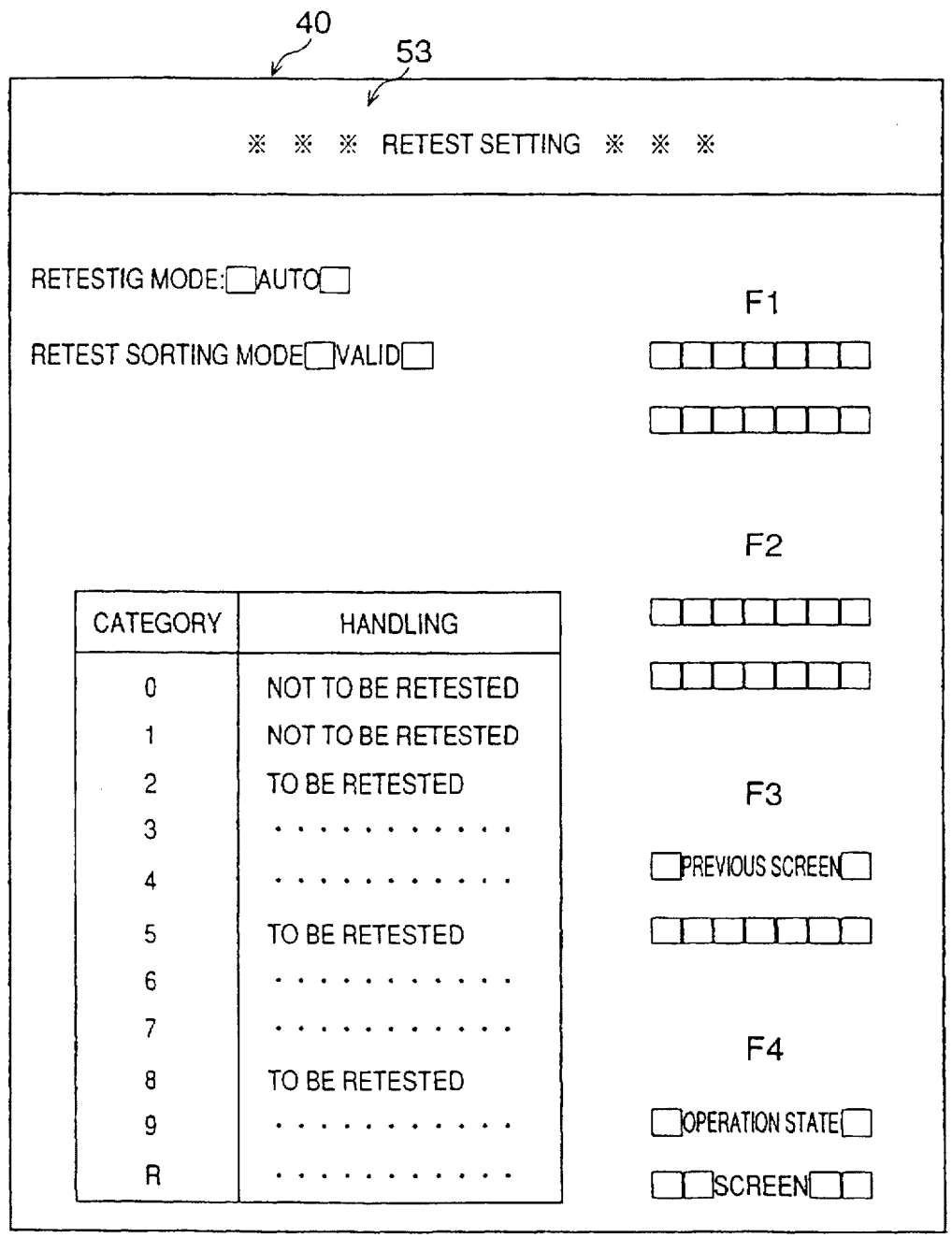
FIG. 12 illustrates an example of the screen image on the display used in the second embodiment of the automatic semiconductor device testing method according to the present invention.

FIG. 11 is a flow chart illustrating the operation of the second embodiment of the automatic testing method according to the present invention, and FIG. 12 illustrates the screen image on the display unit of the IC handler to which the second embodiment of the present invention is applied.

Referring to FIG. 12, the display screen 40 of the controller for setting the control sequence of the IC handler is first operated to generate a retest setting screen 53 on which choice is made regarding the "RETESTING MODE" and "RETEST SORTING MODE" items. The RETESTING MODE item includes the choices "INVALID" and "VALID". When the retest is not to be executed, "INVALID" is chosen whereas "VALID" is selected when the retest is desired to be executed. "VALID" of the retesting mode further includes two valid modes, "MANUAL" and "AUTO". When "MANUAL" is chosen, the transportation of the customer tray from the unloader section 38 to the loader section 37 is to be carried out by hand since no automatic operation takes places. On the other hand, when "AUTO" is chosen as shown in this figure, the customer tray is automatically transported from the unloader section 38 to the loader section 37 by the same operation as in the aforesaid first embodiment. It is because there are some types of IC handlers incapable of automatically transporting customer trays from the unloader section 38 to the loader section 37 that the two valid modes, "MANUAL" and "AUTO" are provided.

The retest sorting mode item includes two choices "INVALID" and "VALID". When "VALID" is chosen, all of the ICs that ought to be sorted into a plurality of categories required to be retested are grouped into a single retest category R, and are, without being sorted, deposited on a customer tray which is in turn stored in a particular rack. When "INVALID" is chosen, the ICs which should be retested are sorted into designated categories and stored, as in the first embodiment described above.

Let it assume that "AUTO" out of "VALID" for the retesting mode is selected and also "VALID" for the retest sorting mode is selected, as shown. In this example there are eleven categories 0 to 9 and R (retest) into which ICs tested may be sorted. On the screen shown in FIG. 12, the categories 0, 1, 2, 5 and 8 are selected, and the categories 0 and 1 are designated "NOT TO BE RETESTED" whereas the categories 2, 5 and 8 are designated "TO BE RETESTED". Therefore, the operational sequence in this case will be as shown in the flow chart of FIG. 11, and the categories 3, 4, 6, 7, 9 and R are not selected and hence will not be used.

Referring to FIG. 11, the first procedure is to set the retesting mode and retest sorting mode at "AUTO" and "VALID", respectively as shown in crosshatches in Step S21. Once the retest setting has been made, the operation of the handler 10 is started in Step S22. Then, in step S23 ICs under test (called "DUT" for short) 15 are transferred from the customer tray 13 on the loader set plate 43 in the loader section 37 through the preciser 36 to the test tray 14 to be placed on the latter. Next, in step S24 the test of the DUTs 15 are carried out in the testing zone 21 within the constant temperature chamber 20. Upon the completion of the test, the DUTs 15 are carried on the test tray 14 to the unloader section 38.

In the next step S25 it is decided whether the retest sorting mode is VALID, whether the test being conducted is the first time test, and whether the ICs fall under any category requiring a retest. According to the initial retest setting conditions, the retest sorting mode is VALID and the test being conducted is the first time test, but the settings for handling the categories have two alternatives, NOT TO BE RETESTED and TO BE RETESTED. Since the categories 0 and 1 are ones requiring no retesting, the DUTs finished with the first time test and found to belong to these categories are judged to be "NO" in step S25, followed by being sorted into categories 0 and 1 and stored in step S31. Hence, the operation ends here.

On the other hand, the DUTs finished with the first time test and found to belong to the categories 2, 5 and 8 requiring a retest are judged to be "YES" in step S25, followed by all being grouped into a single retest category R and stored.

Thereafter, it is decided in step S27 whether the retesting mode is AUTO. Since the mode is set at AUTO (YES) in this example, in the next step S28 the customer tray stored in the rack corresponding to the retest category R in the manner described above is transferred to the rack in the loader section 37 by the transfer arm 33.

If the retesting mode is set at MANUAL, it is judged to be "NO" in step S27, whereupon the handler 10 is immediately stopped in step S29. In the subsequent step S30, the customer tray stored in the rack corresponding to the retest category R is transferred to the rack in the loader section 37 by hand.

Upon preparations for a retest being completed, the procedures return to the step S22 to restart the operation of the handler 10. The operation proceeds from step S22 through steps S23 and S24 to step S25 in which the judgement will be NO since it is the second time test (retest). Thus, all the ICs finished with the second time test are sorted by categories and stored in separate racks each for one category in step S31, whereupon the operation of the handler 10 ends.

As discussed above, according to the second embodiment of the present invention, in addition to the ability to automatically effect the retest, elimination of the need for a wasteful classification by categories after the first time test leads to reduction in the time required for the retest, thereby making it possible to utilize to the semiconductor testing apparatus more effectively. This also provides the advantage of contributing to a cost reduction.

As is evident from the discussion made so far, the IC handler 10 to which the present invention is applied is capable of automatically retesting ICs finished with the first time test. This is because it is possible to automatically transfer the customer tray loaded with ICs finished with the first time test to the loader section 37. It will thus be appreciated that a single IC handler can carry out repeated tests under a plurality of temperature conditions or the like by making the arrangement such that in the IC handler the ICs finished with the first time test are stored, together with the customer tray having them placed thereon, in a rack without sorting them by categories in the unloader section 38, followed by varying the temperature of the constant temperature chamber and automatically conveying the customer tray loaded with the tested ICs to the loader section 37 so that the ICs are subjected to a second time test as they are moved through the constant temperature chamber. In this case, the customer tray in the unloader section 38 may be used as a buffer for temporarily storing the tested ICs. However, if ICs to be tested at a time are relatively as few as can be accommodated in one tray, for example, those ICs may be conveyed directly to the loader section 37 while remaining placed on the test tray without being transferred to the unloader section 38, after the temperature of the constant temperature chamber is varied. It is understood by those skilled in the art that in addition to the applicability to the test under varied temperature conditions, the IC handler arranged as described above is also applicable to various testing systems such as for the purposes of obtaining what is called correlation data for determining deviations between IC handlers by using the same IC; of obtaining temperature characteristics data for evaluating IC devices; and of obtaining evaluation data by applying temperature stresses to IC device packages at multiple points.

By way of example, the IC handler according to this invention may be employed to obtain temperature characteristics data for evaluating prototype devices pilot manufactured; to obtain evaluation data by applying temperature stresses to device packages; to obtain correlation data between IC sockets of a tester head; and to obtain correlation data for periodic temperature calibration of the entire testing system including the IC tester as well by using a standard device the temperature characteristic of which are known. In the last mentioned application, highly precise test results may be achieved by obtaining temperature characteristics data of a single device or a plurality of like devices through repeated measurements at the same temperature and taking the average of the measured data. The same procedures of measurement are conducted successively with respect to a plurality of desired varying points of temperature to take measured data at the various points of temperature.

The present invention is also applicable to a test of devices for their temperature loads in which the devices of the same lot may be subjected to various temperature stresses to collect test data on the liability of the devices to deteriorate and the distribution data regarding the changes in the characteristics.

It is to be understood that if two sets of the soak chamber 22 and test section 21 are arranged in series within the constant temperature chamber 20, a test under two different temperature conditions may be effected during a single pass of the test tray 14 through the constant temperature chamber. It is also possible to carry out a test of ICs under two different temperature conditions with a slight temperature difference between the two during a single pass of the test tray 14 if two stages of the test section 21 are serially arranged with simple heating or cooling means disposed in the downstream stage.

Next, the third embodiment of the automatic testing method according to the present invention will be described with reference to FIGS. 13–17(a) and 17(b). The automatic testing method in this embodiment is intended to provide for automatically measuring the contact characteristics of the contact pins of an IC socket mounted to the tester head in the test section 21 in which the contact characteristics of the contact pins are measured prior to testing ICs. As stated hereinabove, since the IC handler to which the present invention is applied is capable of automatically transferring the customer tray 13 loaded with tested ICs to the loader section 37, a standard test device which is identical in shape to ICs to be tested and the electric characteristics of which are known are carried around a predetermined number of times through the testing zone 21 by a test tray to measure the contact characteristics of the contact pins of all of the sockets in the test section. Specifically, the standard test device which has effected the first time inspection are stored together with a customer tray having them placed thereon, in a rack in the unloader section 38. Then, the test device placed on the customer tray is automatically conveyed to the loader section 37, followed by being carried on a test tray 14 to the testing zone 21 to carry out a second time test. The aforesaid procedures will be repeated until the inspection of all the sockets is completed.

Figure 13:
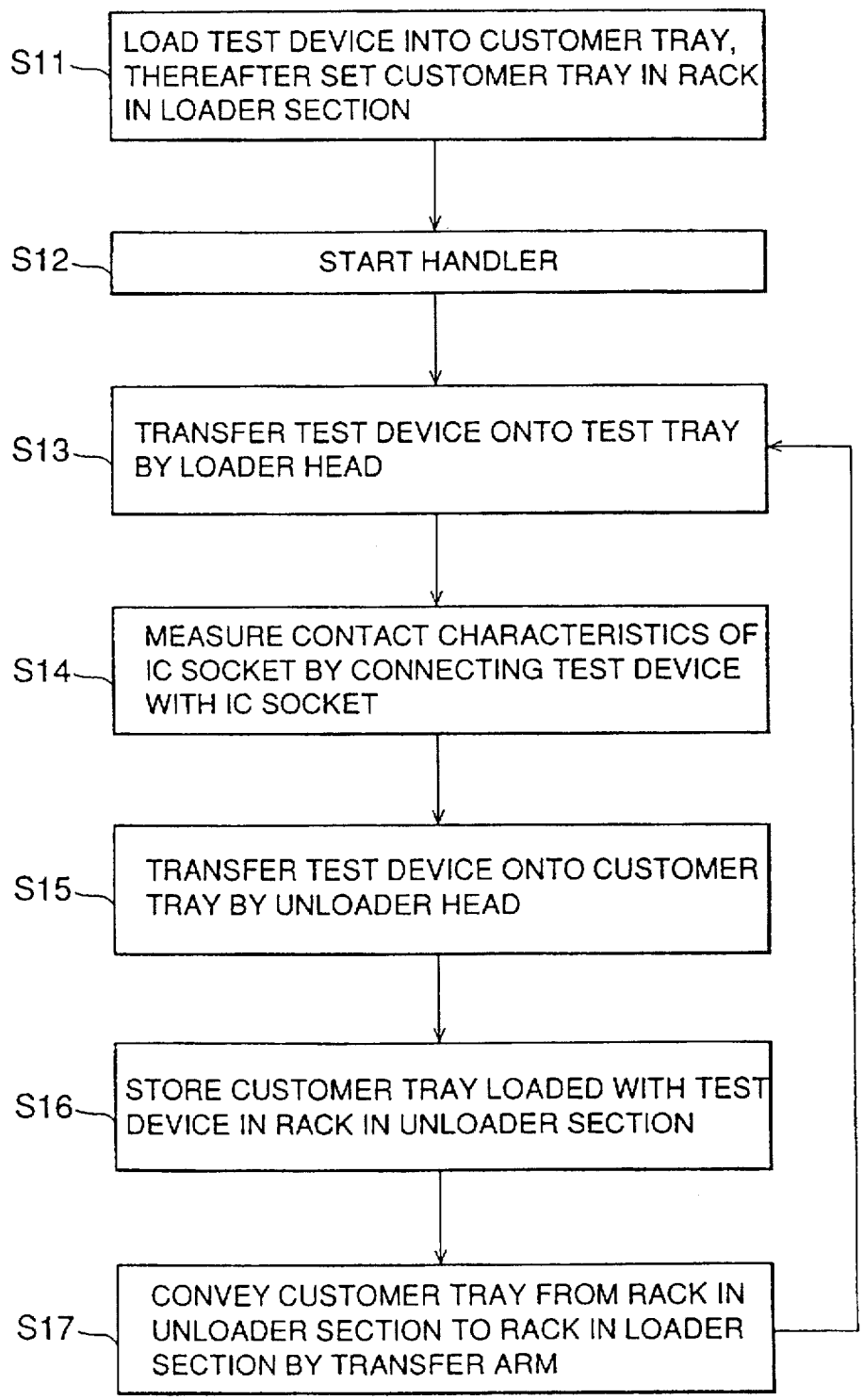
FIG. 13 is a flow chart illustrating the operational sequence of a third embodiment of the automatic semiconductor device testing method according to the present invention.
Figure 14:
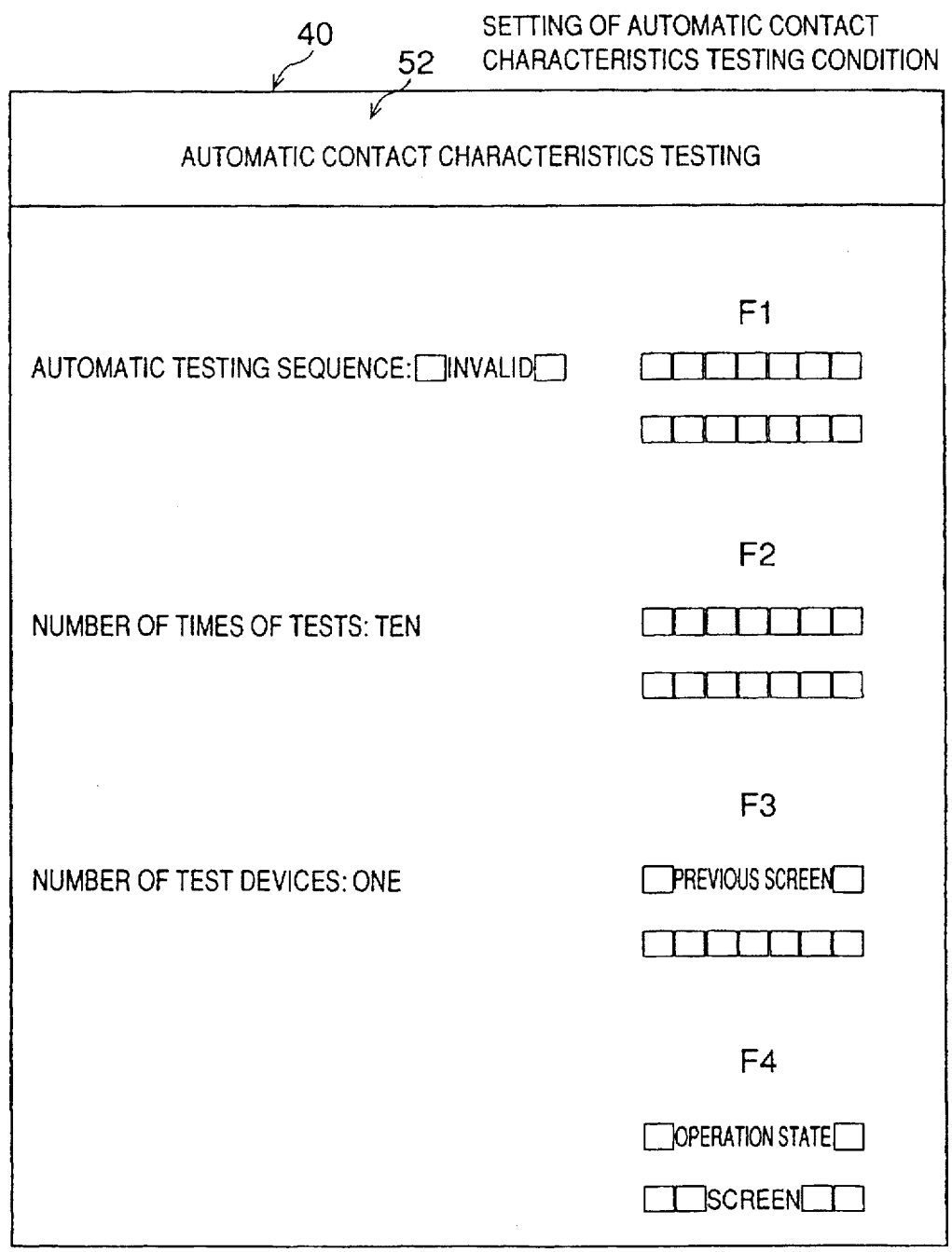
FIG. 14 illustrates an example of the screen image on the display used in the third embodiment of the automatic semiconductor device testing method according to the present invention.

FIG. 13 is a flow chart illustrating the operation of the third embodiment of the automatic testing method according to the present invention, and FIG. 14 illustrates the screen image on the display unit of the IC handler to which the third embodiment of the present invention is applied.

Referring to FIG. 14, the display screen 40 of the controller for setting the control sequence of the IC handler is first operated to generate a screen 52 for setting the automatic contact characteristics testing conditions on which choice is made regarding the "AUTOMATIC TESTING SEQUENCE", "NUMBER OF TIMES OF TESTS" and "NUMBER OF TEST DEVICES" items. The AUTOMATIC TESTING SEQUENCE item includes the choices "INVALID" and "VALID". When the automatic testing is not to be executed, "INVALID" is chosen whereas "VALID" is selected when the automatic testing is desired to be executed. When "VALID" is chosen, the customer tray is automatically transported from the unloader section 38 to the loader section 37 to effect the automatic testing at the number of times set. In the example shown, since the automatic testing sequence is executed, "INVALID" is switched to "VALID". The number of times of tests is selected according to the number of sockets in the test section 21 and the number of test devices used. Shown is the example in which there are ten sockets and one test device is used. Hence, the number of times of tests is set at ten. When there are a greater number of sockets, either the number of test devices used or the number of times of tests may be increased. Of course, increasing the number of test devices used can reduce the time required for testing by a greater factor.

Once the setting has been made as indicated above, the customer tray is loaded with the test device and set up in the rack 31L in the loader section 37 in step S11, as illustrated in FIG. 13. In the next step S12, the handler 10 is started, followed by step S13 in which the customer tray is conveyed to the transfer position where the test device is transferred onto the test tray by the loader head 34. The next step S14 is to measure the contact characteristics of the contact pins of an IC socket in the test section by connecting the test device with the socket. Upon the completion of the test, in the step S15 the test device is carried on the test tray to the unloader section 38, and transferred from the test tray 14 to the customer tray 13 by the unloader head 35. The next step S16 is to store the customer tray 13 loaded with the test device in a predetermined rack in the unloader section. Next in step S17, the customer tray 13 is conveyed again from the rack in the unloader section back into the rack 31L in the loader section 37 by the transfer arm 33. Then, the operation returns to the step S13 to repeat the procedures described above until the contact pins of all the sockets are inspected for their contact characteristics. In this example the procedures are repeated nine times.

Figure 15:
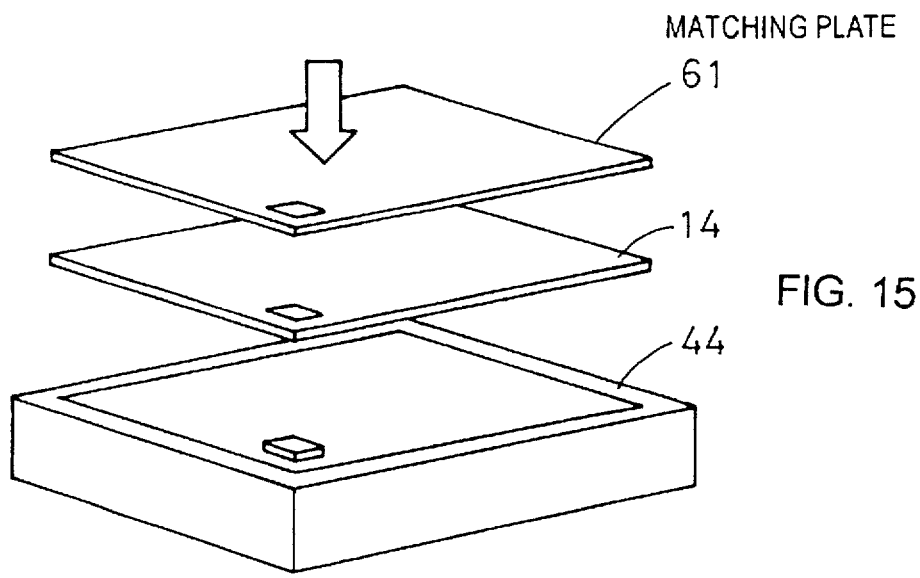
FIG. 15 is a schematic perspective view of the tester head section used in the third embodiment of the automatic semiconductor device testing method according to the present invention.
Figure 16:
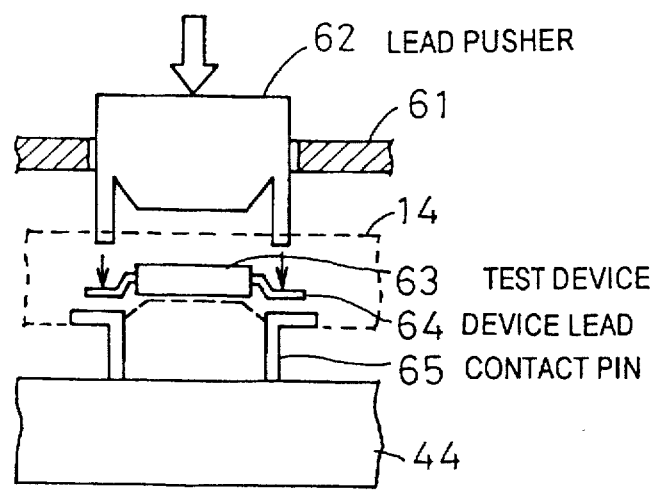
FIG. 16 is a schematic cross-sectional view of the tester head section of FIG. 15.

FIGS. 15 and 16 illustrate an automated mechanism whereby a test device 63 is placed on a test tray 14 and they are conveyed in their entirety to the test section 21 where the leads 64 of the test device 63 are pushed into contact with the contact pins 65 of a socket mounted to a tester head 44 by a matching plate 61 and a lead pusher 62. Such automated mechanism is needed in order to avoid the device leads from being subject to any deformation which would occur if the test device were forced against the contact pins 65 of the socket directly by the loader head as conventionally, because the recent trends with semiconductor devices are toward miniaturization in every dimension and reduction in weight, attended with a corresponding weakness in the mechanical strength.

Figure 17A:
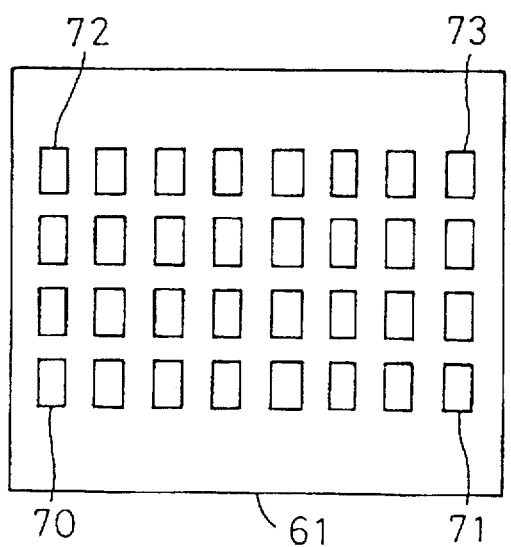
Figure 17B:
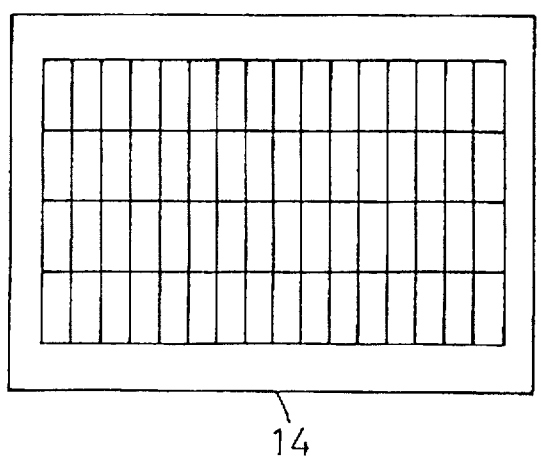

In addition, in recent years the tester head is provided with an increased number of sockets, and the semiconductor device is built up of processed parts in order to compensate for reduced mechanical strength. Consequently, the contact conditions of the sockets with the devices may delicately vary between the devices located in the first compartment 70, the eighth compartment 71, the twenty-fifth compartment 72, and the thirty-two compartment 73, for example, as shown in FIGS. 17(a) and 17(b). Accordingly, while it was heretofore necessary to manually inspect the contact characteristics of all of the sockets which are, for example, thirty-two in number beforehand, the present invention permits automatic measurement of the contact characteristics of sockets whereby the contact characteristics of all of the sockets may be measured effectively and reliably and yet in a short time. Moreover, the complete automation relying on no human hands positively avoids the device leads from being subject to any undesirable deformation which might occur if the test device were brought into contact against the contact pins, thereby insuring more reliable testing of the purer contact characteristics of the sockets (tester head).

While ICs are illustrated as a semiconductor device in the foregoing description, it is needless to say that the present invention is applicable to testing semiconductor devices other than ICs with equal functional effects.

What is claimed is:

1. An automatic semiconductor device testing system including an automatic socket testing apparatus inspecting sockets of said automatic semiconductor device testing system, said automatic semiconductor device testing system comprising a semiconductor device testing apparatus having incorporated therein a semiconductor transporting and handling apparatus having forced horizontal transporting of semiconductor devices from a loader section to a test section to test them and then transporting the tested semiconductor devices from said test section to an unloader section to sort them on the basis of the test results, said automatic socket testing apparatus comprising:

a device for testing having a same shape as that of the semiconductor devices to be tested and known electric characteristics;

a customer tray carrying said device for testing thereon;

tray storing means disposed in each of said loader and unloader sections and storing customer trays;

a test tray conveying the device for testing from said loader section to said unloader section through said test section;

means for transferring the device for testing carried on the customer tray from said customer tray onto the test tray in said loader section;

means for transferring the device for testing carried on the test tray from said test tray onto said customer tray in said unloader section;

means for storing said customer tray with the device for testing in the tray storing means in said unloader section;

tray transfer means for transferring the customer tray with the device for testing stored in the tray storing means in said unloader section onto the tray storing means in said loader section; and means for repetitively transporting said device for testing to said test section to measure the electric characteristics of all of the sockets in said test section before testing semiconductor devices to be tested by sequentially bringing said device for testing into electrical contact with each of said sockets one socket per one transport, using the customer tray, the test tray, the means for transferring the device for testing in said loader section, the means for transferring the device for testing in said unloader section, the means for storing the customer tray, and the tray transfer means.

2. The automatic semiconductor device testing system according to claim 1, wherein a plurality of said devices for testing are provided, each having a same shape as that of semiconductor devices to be tested and known electric characteristics, and a plurality of sockets provided in said test section so that the electric characteristics of all of the sockets in said test section can be measured by sequentially bringing said plurality of sockets respectively per one transport, before testing the semiconductor devices.

3. An automatic socket testing method for use in an automatic semiconductor device testing system which comprises a semiconductor device testing apparatus having incorporated therein a semiconductor transporting and handling apparatus having forced horizontal transporting of semiconductor devices from a loader section to a test section to test them and then transporting the tested semiconductor devices from said test section to an unloader section to sort them on the basis of the test results, said automatic socket testing method comprising the steps of:

(a) placing on a customer tray a device for testing having a same shape as that of semiconductor devices to be tested and known electric characteristics, and storing the customer tray with the device for testing thereon in tray storing means disposed in said loader section;

(b) conveying said customer tray loaded with the device for testing thereon and stored in said tray storing means in said loader section to a transfer position in said loader section;

(c) transferring the device for testing carried on the customer tray from said customer tray onto a test tray in said loader section;

(d) conveying said test tray to said test section to bring said device for testing carried thereon into electric contact with a socket in said test section for measuring the contact characteristics of the socket;

(e) transferring, upon completion of said measurement, the device for testing from the test tray to a customer tray in said unloader section;

(f) storing the customer tray with the device for testing thereon in tray storing means in said unloader section;

(g) transferring said customer tray with the device for testing thereon stored in the tray storing means in said unloader section to the tray storing means in said loader section; and (h) repeating the aforesaid steps (b) to (g) until measurements of all of the sockets in said test section are completed for their contact characteristics.

4. The automatic socket testing method according to claim 3, wherein a plurality of said devices for testing are provided, each having a same shape as that of semiconductor devices to be tested and known electric characteristics, and a plurality of sockets provided in said test section so that said plurality of devices for testing can be brought into electrical contact with said plurality of sockets respectively per one transport.

5. An automatic semiconductor device testing method for use in an automatic semiconductor device testing system which comprises a semiconductor device testing apparatus having incorporated therein a semiconductor transporting and handling apparatus having forced horizontal transporting of semiconductor devices from a loader section to a test section to test them and then transporting the tested semiconductor devices from said test section to an unloader section to sort them on the basis of the test results, said automatic semiconductor device testing method comprising the steps of:

(a) placing semiconductor devices to be tested on a customer tray and storing the customer tray with the devices thereon in a tray storing means disposed in said loader section;

(b) conveying said customer tray with the devices thereon stored in the tray storing means in said loader section to a transfer position in said loader section;

(c) transferring the semiconductor devices to be tested carried on the customer tray onto a test tray;

(d) conveying the test tray to said test section to bring the semiconductor devices carried thereon into electric contact with a socket in said test section for measuring the electric characteristics of each of the devices;

(e) sorting, upon completion of said measurement, the tested devices by categories on the basis of the test results wherein the tested devices coming under more than one categories requiring a retest are gathered together without being sorted by categories and transferred to a corresponding customer tray while the tested devices coming under at least one category requiring no retest are sorted by categories and transferred to at least one corresponding customer tray;

(f) transferring said customer tray carrying thereon the tested devices required to be retested from the tray storing means in said unloader section to the tray storing means in said loader section; and (g) repeating the aforesaid steps (b) to (e) so that the tested devices of more than one categories found in the first test to need a retest can be retested all together without being sorted.

* * * * *